(12) United States Patent
Kikuchi et al.

(10) Patent No.: US 6,278,153 B1
(45) Date of Patent: Aug. 21, 2001

(54) THIN FILM CAPACITOR FORMED IN VIA

(75) Inventors: Katsumi Kikuchi; Tadanori Shimoto; Koji Matsui; Akinobu Shibuya, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/420,561

(22) Filed: Oct. 19, 1999

(30) Foreign Application Priority Data

Oct. 19, 1998 (JP) .................................................. 10-297040
Feb. 2, 1999 (JP) .................................................. 11-025316

(51) Int. Cl.$^7$ .......................... H01L 27/108; H01L 29/76; H01L 29/94; H01L 31/119; H01L 31/062
(52) U.S. Cl. .......................... 257/310; 257/295; 257/306; 257/532
(58) Field of Search .................... 257/295, 310, 257/532, 306, 301, 303, 304, 311, 758

(56) References Cited

U.S. PATENT DOCUMENTS

| | | | |
|---|---|---|---|
| 5,341,026 | * | 8/1994 | Harada et al. ........................ 257/764 |
| 5,798,903 | * | 8/1998 | Dhote et al. ......................... 257/295 |
| 5,851,870 | * | 12/1998 | Algubin et al. ...................... 438/239 |
| 5,918,135 | * | 6/1999 | Lee et al. ............................. 438/393 |
| 5,952,687 | * | 9/1999 | Kawakubo et al. .................. 257/296 |
| 5,976,928 | * | 11/1999 | Kirlin et al. ......................... 438/240 |
| 6,008,083 | * | 12/1999 | Brabazon ............................. 438/239 |
| 6,046,469 | * | 4/2000 | Yamazaki et al. ................... 257/306 |

FOREIGN PATENT DOCUMENTS

| | | |
|---|---|---|
| 63-305550 | 12/1988 | (JP) . |
| 2-303091 | 12/1990 | (JP) . |
| 5-226844 | 9/1993 | (JP) . |
| 6-132661 | 5/1994 | (JP) . |
| 6-140733 | 5/1994 | (JP) . |
| 6-334334 | 12/1994 | (JP) . |
| 7-30257 | 1/1995 | (JP) . |
| 7-48424 | 2/1995 | (JP) . |
| 7-307567 | 11/1995 | (JP) . |
| 8-83796 | 3/1996 | (JP) . |
| 8-88318 | 4/1996 | (JP) . |
| 8-97214 | 4/1996 | (JP) . |
| 9-64493 | 3/1997 | (JP) . |
| 10-51105 | 2/1998 | (JP) . |
| 10-56148 | 2/1998 | (JP) . |
| 10-154878 | 6/1998 | (JP) . |

\* cited by examiner

*Primary Examiner*—Eddie C. Lee
*Assistant Examiner*—Jesse A. Fenty
(74) *Attorney, Agent, or Firm*—Young & Thompson

(57) ABSTRACT

There is provided a thin film capacitor including (a) a lower electrode, (b) an insulating layer formed burying the lower electrode therein and formed with a via-hole reaching the lower electrode, (c) a dielectric layer formed on an inner sidewall of the via-hole and covering an exposed surface of the lower electrode therewith, and (d) an upper electrode surrounded by the dielectric layer. In accordance with the thin film capacitor, the upper electrode is formed to be buried in the via-hole formed above the lower electrode. Hence, it is possible to prevent short-circuit between the upper and lower electrodes, and degradation of the dielectric layer during fabrication of a thin film capacitor, both of which enhances reliability of a capacitor. In addition, a multi-layered wiring structure could be readily fabricated on the thin film capacitor.

30 Claims, 23 Drawing Sheets

THIN FILM CAPACITOR FORMED IN VIA

BACKGROUND OF THE INVENTION

1. Field of the Invention

The invention relates to a thin film capacitor used as an element in various electronic circuits, and also to a wiring-patterned structure used in a wiring board.

2. Description of the Related Art

There has been know a single-layered thin film capacitor including a first electrode layer, a dielectric layer formed on the first electrode layer, and a second electrode layer formed on the dielectric layer, as suggested in Japanese Unexamined Patent Publication Nos. 5-226844, 8-88318 and 10-154878. There has been also known a thin film capacitor having a multi-layered substrate including a substrate, a ground layer formed on the substrate, a dielectric layer formed on the ground layer, and an electrically conductive layer formed on the dielectric layer, as suggested in Japanese Unexamined Patent Publication Nos. 7-30257 and 7-307567.

These thin film capacitors are generally designed to include an upper electrode, a lower electrode, and a dielectric layer sandwiched between the upper and lower electrodes, and are accompanied with the following problems.

The first problem is that the upper electrode is liable to short-circuit with the lower electrode.

FIG. 1A is a cross-sectional view of a thin film capacitor. The illustrated thin film capacitor is comprised of a substrate 90, a lower electrode 91 formed on the substrate 90, a dielectric layer 92 formed on the lower electrode 91, and an upper electrode 93 formed on the dielectric layer 92.

If the thin film capacitor is properly fabricated in such a configuration as designed, the thin film capacitor would have such a structure as illustrated in FIG. 1A. However, if the upper electrode 93 is formed out of place, for instance, the upper electrode 93 would make contact with the lower electrode 91, resulting in occurrence of short-circuit between the upper electrode 93 and the lower electrode 91, as illustrated in FIG. 1B.

The upper electrode 93 may be designed to have a width smaller than a width of the lower electrode 91 in order to avoid such short-circuit, which, however, would cause a problem that a capacitor has to be formed in a greater size for ensuring a desired capacity. This results in reduction in a density of wiring. In order to avoid reduction in a capacity of a capacitor, it would be necessary to re-design a capacitor with respect to configuration thereof.

The second problem is that it is difficult to form multi-layered wirings in the above-mentioned capacitor having a multi-layered structure. A multilayered wiring substrate including a thin film capacitor therein is formed with via-holes in order to electrically connect electrodes of thin film capacitors formed in upper and lower layers, to each other.

As such a via-hole, there are known a filled via-hole as shown in Japanese Unexamined Patent Publication No. 7-30257 and a postless via-hole as shown in Japanese Unexamined Patent Publication No. 7-307567. A filled via-hole is used more widely than a postless via-hole. This is because that a filled via-hole can vertically connect an electrode formed in an upper layer to an electrode layer formed in a lower layer to thereby increase a wiring density.

However, when a filled via-hole is formed in the above-mentioned capacitor having a multi-layered structure, it is unavoidable that there is formed a step having a height in the range of 2 to 20 μm between the upper and lower electrodes.

As a result, there is also formed a step or irregularity on an outer surface of a resultant thin film capacitor. Thus, it is quite difficult to properly form a power-feeding layer absolutely required for formation of a filled via-hole.

FIG. 2 illustrates a thin film capacitor in which this problem is caused. The illustrated thin film capacitor is comprised of a substrate 94, a lower electrode 95, a dielectric layer 96 formed on the lower electrode 95, an upper electrode 97 formed on the dielectric layer 96, and a power-feeding layer 98 covering the upper electrode 97, the dielectric layer 96 and the lower electrode 95 therewith. A filled via-hole 99 is formed above the upper electrode 97.

As illustrated in FIG. 2, the lower electrode 95 is liable to be reverse-tapered when patterned. As a result, there is formed a step between the substrate 94 and the lower electrode 95, which would cause breakage of the power-feeding layer 98. Thus, a filled via-hole is liable to be improperly formed.

Though Japanese Unexamined Patent Publication No. 10-154878 has suggested a solution to this problem, the suggested solution is accompanied with another problem that fabrication steps become unavoidably complicated.

The third problem is that the above-mentioned capacitor having a multi-layered structure is fabricated through a quite complicated fabrication process. This is because it is necessary in the process to carry out film deposition and film patterning for each of electrode layers and a dielectric layer.

The fourth problem is that a dielectric layer is sometimes deteriorated in quality during a thin film capacitor fabrication process.

A dielectric layer is patterned generally through a dry etching step and a washing step for removal of etching residue. Removal of etching residue has to be absolutely carried out for enhancement in reliability of a thin film capacitor. In general, acid is selected for washing in order to sufficiently wash a dielectric layer. However, since etching residue is composed mainly of a material resulted from reaction between a dielectric material of which a dielectric layer is composed and etching gas, acid which is capable of dissolving etching residue can dissolve the dielectric layer. As a result, the dielectric layer is partially reduced in a thickness or is subject to alteration in composition.

This problem as mentioned above occurs when a dielectric layer is patterned by wet etching through the use of acid, as well as when a dielectric layer is patterned by dry etching. Furthermore, the above-mentioned problem remarkable occurs when a dielectric layer is composed of perovskite-structured material such as BST ($Ba_xSr_{1-x}TiO_3$), PZT ($PbZr_xTi_{1-x}O_3$), PLZT ($Pb_{1-Y}La_YZr_xTi_{1-x}O_3$) and $SrBi_2Ta_2O_9$. Such perovskite-structured material is preferably used to a need for fabricating a capacitor in a smaller size with a higher capacity. However, if such perovskite-structured materials washed with acid, particular ingredients are dissolved out, which would cause alteration in composition. The materials having perovskite-structure have electricity characteristic which significantly varies due to even small alteration in composition, resulting in that the above-mentioned problem becomes remarkable.

On the other hand, conventional methods of forming an electrically conductive wiring can be grouped into a subtractive method and an additive method. A subtractive method is a method in which an electrically conductive wiring is formed by etching a copper foil formed on a substrate or a resin. For instance, Japanese Unexamined Patent Publication No. 10-51105 has suggested one of such subtractive methods. An additive method is a method in which an electrically conductive wiring is formed by electroless plating or electroplating.

The above-mentioned additive method may be grouped further into a semi-additive method as suggested in Japanese Unexamined Patent Publication No. 9-64493 and a full additive method as suggested in Japanese Unexamined Patent Publication No. 6-334334. A semi-additive method is a method in which an electrical conductor is formed in a resist film by electroplating after formation of a power-feeding layer, and, after removal of the resist film, the power-feeding layer is etched into a wiring pattern. A full additive method is a method in which a resist film is patterned after a substrate has been activated at a surface thereof, and an electrical conductor is formed by electroless plating with the resist film being used as a mask.

The above-mentioned subtractive and semi-additive methods are both accompanied with a problem that since a via-hole, which is a vertically extending passage for electrically connecting upper and lower wiring layers to each other, is reverse-tapered in shape, high reliability in electrical connection cannot be ensured.

In addition, such reverse-shaped via-hole provides only small designability, because another via-hole cannot be formed above the previously formed via-hole.

Furthermore, since a patterned electrical conductor projects above a substrate and an insulating resin layer, when there is to be formed a multi-layered wiring structure by forming an insulating layer and then another patterned electrical conductor above the previously formed electrical conductor, it would be quite difficult to reduce the insulating layer in thickness, and remove irregularity at a surface to thereby planarize the multi-layered wiring structure.

The full additive method in which an electrical conductor is formed by electroless plating has an advantage that it is possible to form the electrical conductor without steps, or planarize the electrical conductor, because it is relatively easy to equalize a thickness of a patterned resist film to a thickness of an electrical conductor.

However, since a patterned resist film is formed after catalyser has been absorbed into a substrate or an insulating resin film, there are caused problems that metal is not precipitated in plating because catalyser has been removed in a step of developing the resist film, which causes breakage of a wiring, and that adhesion between the resist film and an underlying layer is weakened.

In addition, since catalyser remains in a region where a patterned electrical conductor is not formed, migration of metal ions is liable to occur, which reduces reliability in electrical insulation. This problem becomes more remarkable in fabrication of a wiring in a smaller size.

Japanese Unexamined Patent Publication No. 63-305550 has suggested a semiconductor memory device including a memory cell comprised of a capacitor and a transistor. A semiconductor substrate is formed with a trench. A capacitor dielectric film is formed on an inner wall of the trench. A capacitor electrode is completely buried in the trench without extending to a surface of the semiconductor substrate. The capacitor dielectric film has a cutout portion through which the capacitor electrode makes electrical contact with a source or drain of the transistor.

Japanese Unexamined Patent Publication No. 2-303091 has suggested a substrate including a capacitor formed therein, wherein a portion of the substrate acts as a dielectric layer of the capacitor. First and second terminal electrodes are formed on an upper surface of the substrate in electrical isolation to each other, and electrode patterns are formed on a lower surface of the substrate in symmetrical location of the first and second terminal electrodes about the substrate. A first capacitor is formed between the first terminal electrode and one of the electrode patterns, and a second capacitor is formed between the second terminal electrode and the other of the electrode patterns. The first and second capacitors cooperate to each other to form a series circuit, which constitutes the capacitor formed in the substrate.

Japanese Unexamined Patent Publication No. 10-56148 has suggested a ferroelectric memory device including an insulating substrate, a semiconductor layer formed on a surface of the insulating substrate, a field effect transistor formed in the semiconductor layer, a column-shaped lower electrode making electrical contact with a diffusion layer of the field effect transistor and buried in the insulating substrate, a ferroelectric film at least partially covering a periphery of the lower electrode therewith, and an upper electrode covering the ferroelectric film therewith.

Japanese Unexamined Patent Publication No. 6-140733 has suggested a circuit board including an insulator having input and output terminals and a wiring layer at a surface thereof, input and output pads formed on the input and output terminals, and a mount formed on the wiring layer for mounting a semiconductor device with a solder bump sandwiched therebetween. The input and output pads include first nickel-plated layers formed on the input and output terminals, and a second nickel-plated layer formed on the first nickel-plated layers by electroless plating. The mount includes a nickel-sputtered layer formed on the wiring layer by sputtering, and a third nickel-plated layer formed on the nickel-sputtered layer by electroless plating.

Japanese Unexamined Patent Publication No. 8-97214 has suggested a method of fabricating a semiconductor device, including the steps of forming an opening in an insulating film formed on a semiconductor substrate, to thereby expose an underlying semiconductor region, forming an adhesive barrier metal layer by depositing an adhesive metal film having high adhesion with the insulating film, and a barrier metal film, depositing a first metal film, oxide of which is an insulator, to thereby cover a surface of the insulating film, a sidewall of the opening and an exposed surface of the semiconductor region, burying a mask in the opening, oxidizing the first metal film though the use of the mask, removing the mask, filling the opening with metal by plating, removing the oxide and a portion of the first metal film located just below the oxide to thereby expose the barrier metal film, and forming a second metal film as an upper wiring in selected regions.

Japanese Unexamined Patent Publication No. 6-132661 has suggested a method of fabricating a multi-layered wiring structure including first and second insulating layers each composed of photosensitive resin and first and second circuit patterns each composed of metal, said insulating layers and said circuit patterns being alternately deposited one on another, the method comprising the steps of forming a two-layered pre-circuit pattern on the first insulating layer by etching or lift-off, said pre-circuit pattern including a first layer for preventing diffusion, composed of metal having high adhesion to the first insulating layer, and a second layer for preventing oxidation, composed of metal which has high resistance to oxidation, forming a third layer on the pre-circuit pattern by plating, said third layer being composed of highly electrically conductive metal, forming a fourth layer on the third layer by plating, said fourth layer being composed of metal which does not react with photosensitive resin, forming the second insulating layer on the second circuit pattern, and repeating the above-mentioned steps.

Japanese Unexamined Patent Publication No. 8-83796 has suggested electroless plating bath used for forming a wiring layer in a semiconductor device, comprising metal containing metal ions, a reducing agent containing no metals in a chemical formula thereof and reducing said metal ions, a complexing agent containing no metals in a chemical formula thereof and complexing said metal ions, and a pH adjuster containing no metals in a chemical formula thereof

SUMMARY OF THE INVENTION

In view of the above-mentioned problems, it is an object of the present invention to provide a thin film capacitor which is capable of avoiding short-circuit between upper and lower electrodes and preventing degradation of a dielectric layer in quality, and which is suitable for formation of a multi-layered wiring structure.

It is also an object of the present invention to provide a substrate including such a thin film capacitor therein.

It is also an object of the present invention to provide a method of fabricating such a thin film capacitor.

Another object of the present invention is to provide a patterned structure which enhances reliability in an electrical conductor, and enhances designability of the same.

In one aspect of the present invention, there is provided a thin film capacitor including (a) a lower electrode, (b) an insulating layer formed burying the lower electrode therein and formed with a via-hole reaching the lower electrode, (c) a dielectric layer formed on an inner sidewall of the via-hole and covering an exposed surface of the lower electrode therewith, and (d) an upper electrode surrounded by the dielectric layer.

There is further provided a thin film capacitor including (a) a lower electrode, (b) a first insulating layer formed burying the lower electrode therein and formed with a via-hole reaching the lower electrode, (c) a dielectric layer formed on an inner sidewall of the via-hole and covering an exposed surface of the lower electrode therewith, (d) an upper electrode surrounded by the dielectric layer, (e) a second insulating layer formed over the first insulating layer, the dielectric layer, and the upper electrode, and formed with a via-hole reaching the upper electrode, and (f) a wiring layer formed on the second insulating layer and making electrical connection with the upper electrode through the via-hole.

In another aspect of the present invention, there is provided a substrate including therein such a thin film capacitor as mentioned above.

The substrate may be used as a substrate on which a semiconductor device such as IC is to be mounted.

In still another aspect of the present invention, there is provided a method of fabricating a thin film capacitor, including the steps of (a) forming a lower electrode either directly on a substrate or on a substrate with an insulating film sandwiched therebetween, (b) forming an insulating layer over the lower electrode and the substrate, (c) forming a via-hole through the insulating layer so that the via-hole reaches the lower electrode, to thereby expose a portion of a surface of the lower electrode, (d) forming a dielectric layer so that the dielectric layer covers at least the exposed portion of a surface of the lower electrode, and (e) forming an electrically conductive layer on the dielectric layer.

The above-mentioned thin film capacitor, substrate, and method of fabricating a thin film capacitor in accordance with the present invention provide various advantages. Hereinbelow are explained those advantages with reference to FIG. 3 which is a cross-sectional view illustrating a thin film capacitor in accordance with an embodiment of the present invention.

The first advantage is that it is possible to prevent short-circuit between upper and lower electrodes.

In the thin film capacitor in accordance with the present invention, an insulating layer 12 is formed so as to bury a lower electrode 13 therein, as illustrated in FIG. 3. The insulating layer 12 is formed with a via-hole reaching the lower electrode 13, and an upper electrode 15 is formed in the via-hole. Hence, there is not caused short-circuit between the lower electrode 13 and the upper electrode 15 due to such improper location of the upper electrode 15 as illustrated in FIG. 1B.

The second advantage is that a multi-layered wiring structure can be readily formed. This is because the thin film capacitor has a planarized upper surface regardless of irregularity or steps at an upper surface of the lower electrode 13, as illustrated in FIG. 3. Accordingly, a second via-hole and a second thin film capacitor can be readily formed on the thin film capacitor illustrated in FIG. 3.

The third advantage is that a process for fabricating a thin film capacitor is simplified. This is because it is no longer necessary to carry out film deposition and film etching for each of the lower electrode 13, the upper electrode 15 and the dielectric layer 14, and the thin film capacitor can be fabricated by forming the dielectric layer 14 and the upper electrode 15 in a via-hole and removing unnecessary portions of them by etching.

The fourth advantage is that it is possible to prevent degradation of a dielectric layer in a process for fabricating a thin film capacitor.

In the thin film capacitor in accordance with the present invention, the dielectric layer 14 is buried in a via-hole formed in the insulating layer 12, as illustrated in FIG. 3. Hence, the dielectric layer 14 is patterned by etching back to thereby remove an unnecessary portion of the dielectric layer 14, that is, a portion of the dielectric layer 14 in a region around a via-hole. As a result, only an upper portion of the dielectric layer 14 which exerts almost no influence on performances of a capacitor is exposed in a washing step to be carried out subsequently to the step of etching back. Accordingly, it is possible to prevent occurrence of problems of reduction of the dielectric layer 14 in a thickness and alteration in composition of the dielectric layer 14.

There is further provided a method of fabricating a thin film capacitor, including the steps of (a) forming a lower electrode either directly on a substrate or on a substrate with an insulating film sandwiched therebetween, (b) forming an insulating layer over the lower electrode and the substrate, (c) forming a via-hole through the insulating layer so that the via-hole reaches the lower electrode, to thereby expose a portion of a surface of the lower electrode, (d) forming a dielectric layer so that the dielectric layer covers at least the exposed portion of a surface of the lower electrode, (e) forming an electrically conductive layer on the dielectric layer so that the via-hole is not fully filled with the electrically conductive layer, the electrically conductive layer having two- or more-layered structure wherein layers have different resistances from one another, (f) removing at least the outermost layer of the electrically conductive layer in a region other than the via-hole, and (g) forming a metal plating film on the outermost layer in the via-hole.

For instance, the step (f) may further include the steps of forming a mask filling the via-hole therewith, and etching a product resulting from the step (e). This ensures removal of the outermost layer of the electrically conductive layer. By suitably selecting materials of which each layers constituting the electrically conductive layer are composed, it would be possible for layers located in an etched area to be damaged to the smallest degree.

The above-mentioned method provides an additional advantage that the upper electrode can be formed at a desired location, as well as the above-mentioned first to fourth advantages. By removing at least the outermost layer of the electrically conductive layer, layers having different resistances are exposed inside and outside the via-hole, which would make it possible to form a metal plating film at a desired area.

It is preferable that the upper electrode is formed so that the via-hole is entirely filled with the upper electrode.

This ensures that the thin film capacitor would have a planarized upper surface.

It is preferable that upper surfaces of both the insulating layer and the upper electrode are planarized.

This ensures that it is possible to readily fabricate a second thin film capacitor to be formed above the thin film capacitor and a via-hole electrically connecting the second thin film capacitor and the thin film capacitor, resulting in simplification in fabrication steps of forming a multi-layered wiring structure.

It is preferable that the via-hole has a width smaller than a width of the lower electrode.

For instance, as illustrated in FIG. 3, a width of the via-hole in which the dielectric layer 14 and the upper electrode 15 are buried is preferably smaller than a width of the lower electrode 13. This prevents the upper electrode 15 from being formed making contact with the lower electrode 13, and accordingly, it is possible to prevent the upper and lower electrodes 15 and 13 from short-circuiting with each other at ends of the thin film capacitor.

It is preferable that the lower electrode is planar in shape. Herein, the word "planar" means extending in a horizontal direction, and does not include such a shape as the dielectric layer 14 which vertically extends.

It would be possible to effectively prevent the upper and lower electrodes 15 and 13 from short-circuiting with each other by forming the lower electrode 13 to be planar.

The upper electrode may be designed to include a three-layered structure including a first electrically conductive layer, a second electrically conductive layer formed on the first electrically conductive layer, and a third electrically conductive layer formed on the second electrically conductive layer. The first and third electrically conductive layers are composed of a metal or metals selected from the group consisting of copper, silver, aluminum, metals belonging to VIIIa group, and metals belonging to Ib group, and the second electrically conductive layer is composed of a metal or metals selected from the group consisting of metals belonging to IVa group, metals belonging to Va group, metals belonging to VIa group, and alloys thereof.

As an alternative, the upper electrode may be designed to include a four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer. The first and third electrically conductive layers are composed of a metal or metals selected from the group consisting of metals belonging to IVa group, metals belonging to Va group, metals belonging to VIa group, and alloys thereof, and the second and fourth electrically conductive layers are composed of a metal or metals selected from the group consisting of copper, silver, aluminum, metals belonging to VIIIa group, and metals belonging to Ib group.

By designing the upper electrode in the above-mentioned manner, the first metal film can be preferably formed. In addition, when the thin film capacitor is to be etched for precipitating the metal film only in a predetermined region, it would be possible for layers outside the via-hole to be less damaged by etching.

The dielectric layer may be composed of a material selected from the group consisting of titanium oxide, tantalum oxide, $Al_2O_3$, $SiO_2$, $Nb_2O_5$, and perovskite family materials.

As an alternative, the dielectric layer may be composed of organic resin which is capable of accomplishing a desired dielectric constant.

The metal plating film may be formed of a metal selected from the group consisting of copper, silver, gold, iron, nickel, tin, platinum, palladium, zinc, and alloys thereof.

It is preferable that the step (f) includes the steps of forming a mask filling the via-hole therewith, and etching the electrically conductive layer.

For instance, the electrically conductive film may be formed in the step (e) so that it includes a three-layered structure including a first electrically conductive layer, a second electrically conductive layer formed on the first electrically conductive layer, and a third electrically conductive layer formed on the second electrically conductive layer, wherein the first and third electrically conductive layers are composed of a metal or metals selected from the group consisting of copper, silver, aluminum, metals belonging to VIIIa group, and metals belonging to Ib group, and the second electrically conductive layer are composed of a metal or metals selected from the group consisting of titanium, chromium, metals belonging to IVa group, metals belonging to Va group, metals belonging to VIa group, and alloys thereof.

As an alternative, the electrically conductive film may be formed in the step (e) so that it includes a four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer, wherein the first and third electrically conductive layers are composed of a metal or metals selected from the group consisting of titanium, chromium, metals belonging to IVa group, metals belonging to Va group, metals belonging to VIa group, and alloys thereof, and the second and fourth electrically conductive layers are composed of a metal or metals selected from the group consisting of copper, silver, aluminum, metals belonging to VIIIa group, and metals belonging to Ib group.

It is preferable that the electrically conductive film is removed in a region other than the via-hole in the step (f) to thereby planarize a product resulting from the step (e).

The thin film capacitor in accordance with the present invention may be fabricated as follows, for instance.

First, a lower electrode is formed on a substrate. Then, an insulating layer is deposited all over the substrate. Then, the insulating layer is formed with a via-hole reaching the lower electrode. Thereafter, a dielectric layer and electrically conductive layers are formed in this order in the via-hole. Then, a resist film is formed over the electrically conductive layers. Then, the resist film is removed so that it remains only in the via-hole. Then, the outermost electrically conductive layer is etched so that it remains only in the via-hole. The resist film residual in the via-hole is removed. Then, electroplating is carried out to thereby precipitate a metal on the residual outermost electrically conductive layer. Thus, there is formed an upper electrode. Then, a surface of tthe product is polished to thereby remove unnecessary portions of the electrically conductive layers and the dielectric layer.

The thus formed thin film capacitor is buried in the insulating film, and has a planarized upper surface. Hence, other circuits can be readily fabricated on the thin film capacitor. In addition, since the upper electrode is formed after the lower electrode has been surrounded by both the insulating layer and the dielectric layer, the upper and lower electrodes are never short-circuited with each other. Since an unnecessary portion of the dielectric layer is removed by polishing, for instance, the process for fabricating the thin film capacitor can be simplified.

Hereinbelow are explained examples of the thin film capacitor in accordance with the present invention.

FIG. 3 is a cross-sectional view of the thin film capacitor fabricated by the method in accordance with the present invention. The illustrated thin film capacitor is comprised of a lower electrode 13 formed on a substrate 11, an insulating layer 12 formed burying the lower electrode 13 therein and formed with a via-hole 12a reaching the lower electrode 13, a dielectric layer 14 formed on an inner sidewall of the via-hole 12a and covering an exposed surface of the lower electrode 13 therewith, and an upper electrode 15 surrounded by the dielectric layer 14.

FIG. 4 is a cross-sectional view of the thin film capacitor fabricated by the method in accordance with the first embodiment of the present invention. The illustrated thin film capacitor is comprised of a lower electrode 23 formed on a substrate 21, an insulating layer 22 formed burying the lower electrode 23 therein and formed with a via-hole 22a reaching the lower electrode 23, a dielectric layer 24 formed on an inner sidewall of the via-hole 22a and covering an exposed surface of the lower electrode 23 therewith, and an upper electrode 29 surrounded by the dielectric layer 14.

The upper electrode 29 is comprised of a three-layered structure 25–27 and a metal film 28 surrounded by the three-layered structure 25–27 in the via-hole 22a. The three-layered structure includes a first electrically conductive layer 25, a second electrically conductive layer 26 formed on the first electrically conductive layer 25, and a third electrically conductive layer 27 formed on the second electrically conductive layer 26.

The first and third electrically conductive layers 25 and 27 are composed of one or more of copper, silver, aluminum, metals belonging to VIIIa group, and metals belonging to Ib group. The second electrically conductive layer 26 is composed of one or more of metals belonging to IVa group, metals belonging to Va group, metals belonging to VIa group, and alloys thereof.

FIG. 5 is a cross-sectional view of the thin film capacitor fabricated by the method in accordance with the third embodiment of the present invention. The illustrated thin film capacitor is comprised of a lower electrode 31 formed on a substrate 30, an insulating layer 32 formed burying the lower electrode 31 therein and formed with a via-hole 32a reaching the lower electrode 31, a dielectric layer 33 formed on an inner sidewall of the via-hole 32a and covering an exposed surface of the lower electrode 31 therewith, and an upper electrode 39 surrounded by the dielectric layer 33.

The upper electrode 39 is comprised of a four-layered structure 34–37 and a metal film 38 surrounded by the three-layered structure 34–37 in the via-hole 32a. The four-layered structure includes a first electrically conductive layer 34, a second electrically conductive layer 35 formed on the first electrically conductive layer 34, a third electrically conductive layer 36 formed on the second electrically conductive layer 35, and a fourth electrically conductive layer 37 formed on the third electrically conductive layer 36.

The first and third electrically conductive layers 34 and 36 are composed of one or more of copper, silver, aluminum, metals belonging to VIIIa group, and metals belonging to Ib group. The second and fourth electrically conductive layers 35 and 37 are composed of one or more of metals belonging to IVa group, metals belonging to Va group, metals belonging to VIa group, and alloys thereof.

Though not illustrated, a wiring or wirings is (are) electrically connected to the lower electrode 13 to allow the lower electrode 13 to accomplish its functions in the thin film capacitors illustrated in FIGS. 3 to 5.

In yet another aspect of the present invention, there is provided a patterned structure including (a) an electrically conductive film having a four- or more-layered structure, (b) an internal electrical conductor surrounded at a bottom and a sidewall thereof by the electrically conductive film, and (c) an upper electrical conductor formed on both the electrically conductive film and the internal electrical conductor.

For instance, the electrically conductive film may be designed to have a four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer, wherein the first and third electrically conductive layers are composed of a metal or metals selected from the group consisting of metals belonging to IVa group, metals belonging to Va group, metals belonging to VIa group, and alloys thereof, and the second and fourth electrically conductive layers are composed of a metal or metals selected from the group consisting of copper, silver, aluminum, metals belonging to VIIIa group, and metals belonging to Ib group.

It is preferable that the second electrically conductive layer has a greater thickness than a thickness of the fourth electrically conductive layer.

In the above-mentioned patterned structure, since a via-hole containing the electrically conductive film and the internal electrical conductor is covered by the upper electrical conductor, and the via-hole is integral with the upper electrical conductor, it would be possible to have reliable connection between upper and lower layers. In addition, since the via-hole is buried, another via-hole may be formed above the via-hole, which enhances designability in fabrication of a a multi-layered wiring structure.

There is further provided a method of fabricating a patterned structure, including the steps of (a) forming a four-layered structure on a substrate which is formed at least one via-hole, the four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer, (b) depositing a resist film on the fourth electrically conductive layer, (c) removing the resist film in a region other than the via-hole, (d) removing the fourth electrically conductive layer in a region other than the via-hole, (e) removing the resist film residual in the via-hole, (f, depositing a first metal film only in the via-hole by electroplating, (g) removing an exposed portion of the third electrically conductive layer to thereby expose the second electrically conductive layer, (h) forming a patterned resist film on the second electrically conductive layer, (i) depositing a second metal film in the patterned resist film by electroplating, (j) removing the patterned resist film, and (k) removing the first and second electrically conductive layers in a region where the patterned resist film used to be.

For instance, the first and third electrically conductive layers may be composed of one or more of titanium, chromium, metals belonging to IVa group, metals belonging to Va group, metals belonging to VIa group, and alloys thereof, and the second and fourth electrically conductive layers may be composed of one or more of copper, silver, aluminum, metals belonging to VIIIa group, and metals belonging to Ib group.

For instance, the first metal film may be composed of copper, silver, gold, iron, nickel, tin, platinum, palladium, zinc, or alloys thereof.

In accordance with the above-mentioned method, the via-hole containing the first to fourth electrically conductive layers and the first metal film is covered by the second metal film. Hence, since the first to fourth electrically conductive layers and the first metal film are integral with the second metal film, it would be possible to have reliable connection between upper and lower layers. In addition, since the via-hole is buried, another via-hole may be formed above the via-hole, which enhances designability in fabrication of a multi-layered wiring structure.

There is still further provided a method of fabricating a patterned structure, including the steps of (a) forming a four-layered structure on a substrate which is formed at least one via-hole, the four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer, (b) depositing a resist film on the fourth electrically conductive layer, (c) removing the resist film in a region other than the via-hole, (d) removing the fourth electrically conductive layer in a region other than the via-hole, (e) removing the resist film residual in the via-hole, (f) depositing a first metal film only in the via-hole by electroplating, (g) removing an exposed portion of the third electrically conductive layer to thereby expose the second electrically conductive layer, (h) forming a patterned resist film on the second electrically conductive layer, (i) removing the second electrically conductive layer in a region not covered with the patterned resist film, (j) removing the patterned resist film, (k) depositing a second metal film by electroplating in a region where the patterned resist film used to be, and (k) removing the first electrically conductive layer in a region where the patterned resist film used not to be.

In accordance with the above-mentioned method, the via-hole containing the first to fourth electrically conductive layers and the first metal film is covered by the second metal film. Hence, since the first to fourth electrically conductive layers and the first metal film are integral with the second metal film, it would be possible to have reliable connection between upper and lower layers. In addition, since the via-hole is buried, another via-hole may be formed above the via-hole, which enhances designability in fabrication of a multi-layered wiring structure.

There is yet further provided a method of fabricating a patterned structure, including the steps of (a) forming first and second electrically conductive layers in this order on a substrate, (b) forming a patterned resist film on the second electrically conductive layer, (c) etching the second electrically conductive layer with the patterned resist film being used as a mask, (d) removing the patterned resist film, (e) depositing a first metal film only on the second electrically conductive layer by electroplating, and (f) removing the first electrically conductive layer in a region not covered with the first metal film.

For instance, the first electrically conductive layer may be composed of a metal or metals selected from titanium, chromium, the group consisting of metals belonging to IVa group, metals belonging to Va group, metals belonging to VIa group, and alloys thereof, and the second electrically conductive layer may be composed of a metal or metals selected from the group consisting of copper, silver, aluminum, metals belonging to VIIIa group, and metals belonging to Ib group.

In accordance with the above-mentioned method, the second electrically conductive layer remains non-etched in a region in which a patterned wiring is to be formed, and the first electrically conductive layer occupies a region where the second electrically conductive layer does not exist. Hence, it is possible to prevent a metal of which the first metal film is composed, from being deposited by electroplating in a region other than the second electrically conductive film. Thus, it would be possible to deposit a metal only in selected regions in accordance with a desired pattern.

There is still yet further provided a method of fabricating a patterned structure, including the steps of (a) forming a four-layered structure on a substrate, the four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer, (b) forming a patterned resist film on the fourth electrically conductive layer, (c) etching the fourth electrically conductive layer with the patterned resist film being used as a mask, (d) removing the patterned resist film, (e) depositing a first metal film only on the fourth electrically conductive layer by electroplating, and (f) removing the third, second and first electrically conductive layers in a region not covered with the first metal film.

In accordance with the above-mentioned method, the fourth electrically conductive layer remains non-etched in a region in which a patterned wiring is to be formed, and the third electrically conductive layer occupies a region where the fourth electrically conductive layer does not exist. Hence, it is possible to prevent a metal of which the first metal film is composed, from being deposited by electroplating in a region other than the fourth electrically conductive layer. Thus, it would be possible to deposit a metal only in selected regions in accordance with a desired pattern.

There is further provided a method of fabricating a patterned structure, including the steps of (a) forming a patterned insulating layer on a substrate, the patterned insulating layer defining at least one via-hole, (b) forming first and second electrically conductive layers in this order on the substrate, (c) depositing a resist film over the second electrically conductive layer, (d) removing the resist film in a region other than the via-hole, (e) etching the second electrically conductive layer to thereby remove the second electrically conductive layer in a region other than the via-hole, (f) removing the resist film in the via-hole, (g) depositing a first metal film only on the second electrically conductive layer by electroplating, and (h) removing the first electrically conductive layer in a region not covered with the first metal film.

In accordance with the above-mentioned method, the second electrically conductive layer remains non-etched, and the first metal film is deposited on the second electrically conductive layer by electroplating. Thus, the first metal can be formed as a wiring with the second electrically conductive layer being patterned. After removal of the exposed first electrically conductive layer by polishing or etching, it would be possible to have a planarized surface by polishing a surface of the product. Namely, it would be possible to form a wiring with the second electrically conductive layer being patterned and a surface of the product being planarized.

There is further provided a method of fabricating a patterned structure, including the steps of (a) forming a patterned insulating layer on a substrate, the patterned insulating layer defining at least one via-hole, (b) forming first and second electrically conductive layers in this order on the substrate, (c) depositing a resist film over the second electrically conductive layer, (d) removing the resist film in a region other than the via-hole, (e) etching the second electrically conductive layer to thereby remove the second electrically conductive layer in a region other than the via-hole, (f) removing the resist film in the via-hole, (g) depositing a first metal film only on the second electrically conductive layer by electroplating, (h) removing the first electrically conductive layer in a region not covered with the first metal film, (i) forming a second insulating layer on a product resulting from the step (h), the second insulating layer being patterned to define at least one second via-hole reaching the first metal film, (j) forming a third insulating layer on the second insulating layer, the third insulating layer being patterned to define at least one third via-hole having a width greater than a width of the second via-hole, and (k) repeating the steps (b) to (h).

The steps (i) to (k) may be repeated by the desired number of times.

There is further provided a method of fabricating a patterned structure, including the steps of (a) forming a patterned insulating layer on a substrate, the patterned insulating layer defining at least one via-hole, (b) forming a four-layered structure on the substrate, the four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer, (c) depositing a resist film over the fourth electrically conductive layer, (d) removing the resist film in a region other than the via-hole, (e) etching the fourth electrically conductive layer to thereby remove the fourth electrically conductive layer in a region other than the via-hole, (f) removing the resist film in the via-hole, (g) depositing a first metal film only on the fourth electrically conductive layer by electroplating, and (h) removing the third, second and first electrically conductive layers in a region not covered with the first metal film.

In accordance with the above-mentioned method, the fourth electrically conductive layer remains non-etched, and the first metal film is deposited on the fourth electrically conductive layer by electrolytic plating. Thus, the first metal can be formed as a wiring with the fourth electrically conductive layer being patterned. After removal of the exposed first to third electrically conductive layer by polishing or etching, it would be possible to have a planarized surface by polishing a surface of the product. Namely, it would be possible to form a wiring with the fourth electrically conductive layer being patterned and a surface of the product being planarized.

There is further provided a method of fabricating a patterned structure, including the steps of (a) forming a patterned insulating layer on a substrate, the patterned insulating layer defining at least one via-hole, (b) forming a four-layered structure on the substrate, the four-layered structure including a first electrically conductive layer, a second electrically conductive layer formed on the first electrically conductive layer, a third electrically conductive layer formed on the second electrically conductive layer, and a fourth electrically conductive layer formed on the third electrically conductive layer, (c) depositing a resist film over the fourth electrically conductive layer, (d) removing the resist film in a region other than the via-hole, (e) etching the fourth electrically conductive layer to thereby remove the fourth electrically conductive layer in a region other than the via-hole, (f) removing the resist film in the via-hole, (g) depositing a first metal film only on the fourth electrically conductive layer by electroplating, (h) removing the third, second and first electrically conductive layers in a region not covered with the first metal film, (i) forming a second insulating layer on a product resulting from the step (h), the second insulating layer being patterned to define at least one second via-hole reaching the first metal film, (j) forming a third insulating layer on the second insulating layer, the third insulating layer being patterned to define at least one third via-hole having a width greater than a width of the second via-hole, and (k) repeating the steps (b) to (h).

The steps (i) to (k) may be repeated by the desired number of times.

There is further provided a method of fabricating a patterned structure, including the steps of (a) forming a patterned insulating layer on a substrate, the patterned insulating layer defining at least one via-hole, (b) forming first and second electrically conductive layers in this order on the substrate, the second electrically conductive layer being composed of a catalyser metal which acts as a catalyser to metals with which electroless plating is carried out, (c) depositing a resist film over the second electrically conductive layer, (d) removing the resist film in a region other than the via-hole, (e) etching the second and first electrically conductive layers in a region other than the via-hole, (f) removing the resist film in the via-hole, and (g) depositing first metal only on the second electrically conductive layer by electroless plating.

In accordance with the above-mentioned method, after formation of the patterned resist film, the second and first electrically conductive layers are etched with the resist film being used as a mask. Then, after removal of the resist film, first metal is deposited further on the second electrically conductive layer by non-electrolytic plating. Since the second and first electrically conductive layers remain in the via-hole, there will never occur disconnection between layers due to non-deposition and reduction in adhesion with an underlying layer. In addition, since the second and first electrically conductive layers are removed in a region other than the via-hole, there will never occur migration of metal ions, which ensures reliability in electrical insulation. Thus, it would be possible to fabricate a multi-layered wiring board having resistance to migration.

There is further provided a method of fabricating a patterned structure, including the steps of (a) forming a patterned insulating layer on a substrate, the patterned insulating layer defining at least one via-hole, (b) forming first and second electrically conductive layers in this order on the substrate, the second electrically conductive layer being composed of a catalyser metal which acts as a catalyser to metals with which electroless plating is carried out, (c) depositing a resist film over the second electrically conductive layer, (d) removing the resist film in a region other than the via-hole, (e) etching the second and first electrically conductive layers in a region other than the via-hole, (f) removing the resist film in the via-hole, (g) depositing first metal only on the second electrically conductive layer by electroless plating, (h) forming a second insulating layer on a product resulting from the step (g), the second insulating layer being patterned to define at least one second via-hole reaching the second electrically conductive layer, (i) forming a third insulating layer on the second insulating layer, the third insulating layer being patterned to define at least one third via-hole having a width greater than a width of the second via-hole, and (j) repeating the steps (b) to (h).

The steps (h) to (j) may be repeated by the desired number of times.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1A:
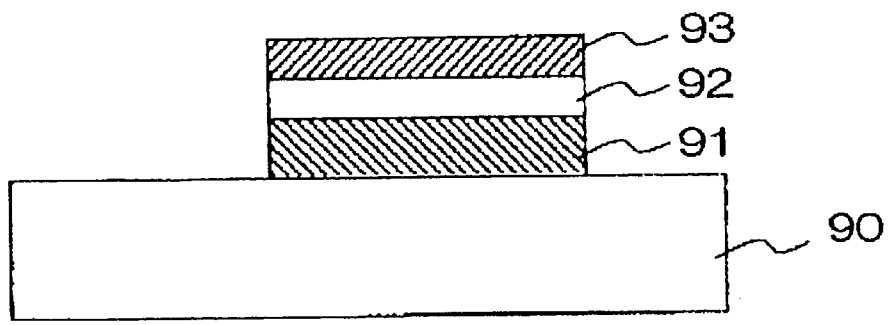
FIG. 1A is a cross-sectional view of a conventional thin film capacitor.
Figure 1B:
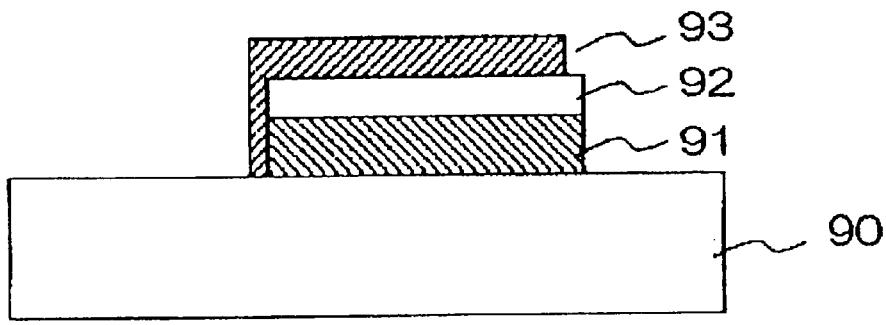
FIG. 1B is a cross-sectional view of another conventional thin film capacitor.
Figure 2:
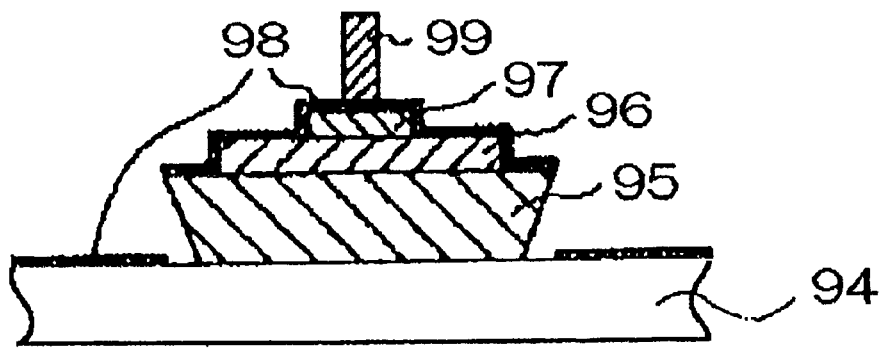
FIG. 2 is a cross-sectional view of still another conventional thin film capacitor.
Figure 3:
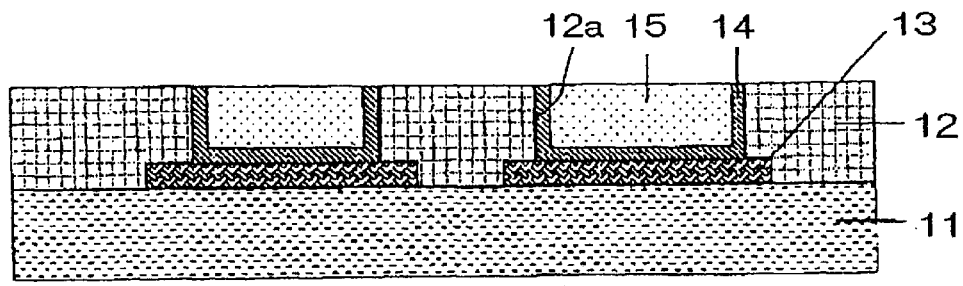
FIG. 3 is a cross-sectional view of a thin film capacitor in accordance with the present invention.
Figure 4:
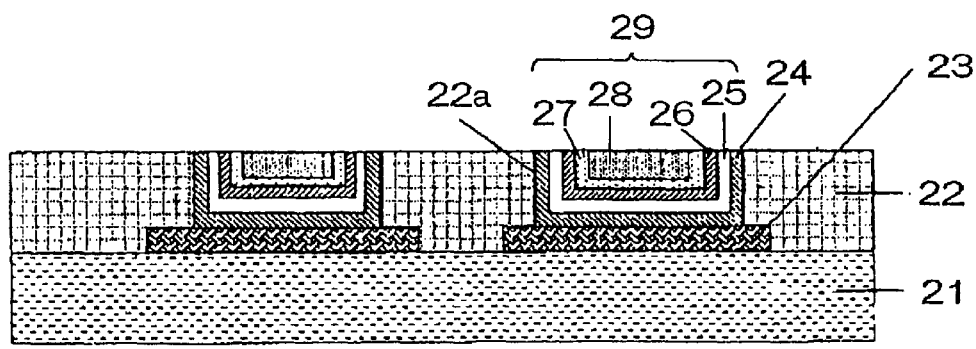
FIG. 4 is a cross-sectional view of a thin film capacitor fabricated by the method in accordance with the first embodiment of the present invention.

FIG. 4 is a cross-sectional view of the thin film capacitor fabricated by the method in accordance with first embodiment of the present invention.

The illustrated thin film capacitor is comprised of a lower electrode 23 formed on a substrate 21, an insulating layer 22 formed burying the lower electrode 23 therein and formed with a via-hole 22a reaching the lower electrode 23, a dielectric layer 24 formed on an inner sidewall of the via-hole 22a and covering an exposed surface of the lower electrode 23 therewith, and an upper electrode 29 surrounded by the dielectric layer 14.

The upper electrode 29 is comprised of a three-layered structure 25–27 and a first metal film 28 surrounded by the three-layered structure 25–27 in the via-hole 22a. The three-layered structure includes a first electrically conductive layer 25, a second electrically conductive layer 26 formed on the first electrically conductive layer 25, and a third electrically conductive layer 27 formed on the second electrically conductive layer 26.

FIGS. 6A to 6I illustrates respective steps of the method of fabricating the thin film capacitor illustrated in FIG. 4.

Figure 6A:
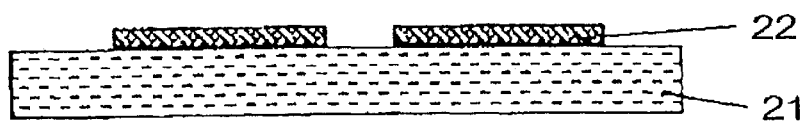
FIGS. 6A to 6I are cross-sectional views of a thin film capacitor, each illustrating respective step of a method of fabricating the thin film capacitor in accordance with the first embodiment of the present invention.

First, as illustrated in FIG. 6A, a lower electrode 22 is formed on a substrate 21 composed of a material such as organic material, ceramic, alumina and silicon. When the lower electrode 22 is to be formed in accordance with an additive method, a power-feeding layer is first formed, then, there is formed a patterned resist film, and then, metal is buried into a pattern by electroplating or electroless plating. Metal to be plated is preferably copper. In place of copper, silver or aluminum may be selected. When the lower electrode 22 is to be formed in accordance with a semi-additive method, there are carried out additional steps as well as the above-mentioned steps in the additive method. That is, the resist film is removed, and then, an unnecessary portion of the power-feeding layer is removed. When the lower electrode 22 is to be formed in accordance with a subtractive method, there are carried out additional steps such as depositing a copper foil, forming a patterned resist film, and etching the copper foil.

Then, an insulating layer 23 is formed all over the substrate 21 and the lower electrode 22. If the insulating layer 23 is composed of liquid material, the liquid material is spread on the substrate 21 by spin-coating, die-coating, curtain-coating or printing. If the insulating layer 23 is composed of a dry film, a plurality of dry films is deposited on the substrate 21 and the lower electrode. Then, the insulating layer 23 is heated to thereby be cured.

Figure 6B:
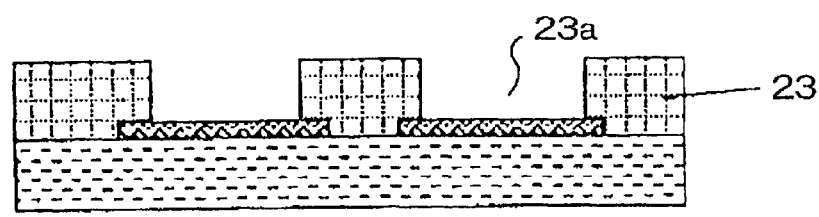

Then, if the insulating layer 23 is composed of photosensitive resin, the insulating layer 23 is patterned by photolithography and etching. If the insulating layer 23 is composed of non-photosensitive resin, the insulating layer 23 is patterned through the use of laser. Thus, there is formed a via-hole or recess 23a throughout the insulating layer 23, as illustrated in FIG. 6B. A capacity of a resultant capacitor is dependent on a size of the via-hole 23a. It is preferable that the lower electrode 22 is formed so as to have a width greater than a width of the via-hole 23a, which ensures that the lower electrode 22 is covered at opposite ends with the insulating layer 23 and that short-circuit between the lower electrode 22 and a later formed upper electrode can be prevented.

A wiring layer or the insulating layer 23 may be formed on the substrate 21 prior to the formation of the lower electrode 22.

Then, a dielectric layer 24 is formed over both the insulating layer 23 and the lower electrode 22 by sputtering, evaporation, chemical vapor deposition (CVD) or anodic oxidation. For instance, the dielectric layer 24 is composed of titanium oxide, tantalum oxide, $Al_2O_3$, $SiO_2$, $Nb_2O_5$, and perovskite family materials such as BST ($Ba_XSr_{1-X}TiO_3$), PZT ($PbZr_XTi_{1-X}O_3$), PLZT ($Pb_{1-Y/aY}Zr_XTi_{1-X}O_3$) and $SrBi_2Ta_2O_9$ wherein $0 \leq X \leq 1$ and $0 < Y < 1$. As an alternative, the dielectric layer 24 is composed of organic resin which is capable of accomplishing a desired dielectric constant.

Figure 6C:
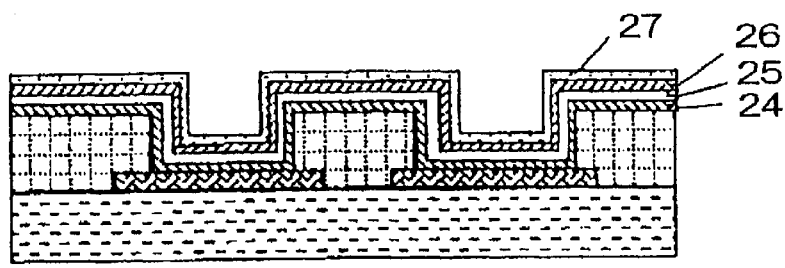

Then, as illustrated in FIG. 6C, the first, second and third electrically conductive thin layers 25, 26 and 27 are formed in this order by sputtering, evaporation or CVD.

The first electrically conductive thin layer 25 is composed preferably of a metal which is capable of uniformizing a voltage during plating. For instance, the first electrically conductive thin layer 25 is composed preferably of copper or silver, because they have a small electric resistance. As an alternative, the first electrically conductive thin layer 25 may be composed of aluminum or transition metals belonging to VIIIa group or Ib group, such as palladium, gold and platinum.

The second electrically conductive thin layer 26 is composed preferably of a metal having high resistance to acid in view of subsequent steps. For instance, the second electrically conductive thin layer 26 is composed preferably of transition metals belonging to IVa group, Va group or VIa group, such as titanium, niobium, tantalum, tungsten and chromium.

The third electrically conductive thin layer 27 is composed preferably of a metal having small electric resistance. For instance, the third electrically conductive thin layer 27 is composed preferably of copper or silver. As an alternative, the third electrically conductive thin layer 27 may be composed of aluminum or transition metals belonging to VIIIa group or Ib group, such as palladium, gold and platinum.

Figure 6D:
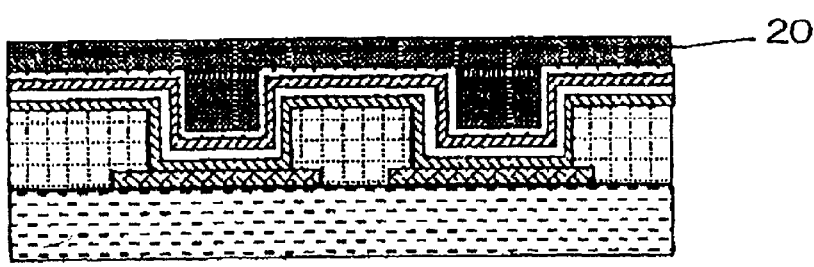

Then, as illustrated in FIG. 6D, resist 20 is deposited over the third electrically conductive thin layer 27. If the resist 20 is composed of liquid material, the liquid material is deposited on the third electrically conductive layer 27 by spin-coating, die-coating, curtain-coating or printing. If the resist 20 is composed of a dry film, a plurality of dry films is deposited on the third electrically conductive thin layer 27. Then, the resist 20 is heated to thereby be cured.

Figure 6E:
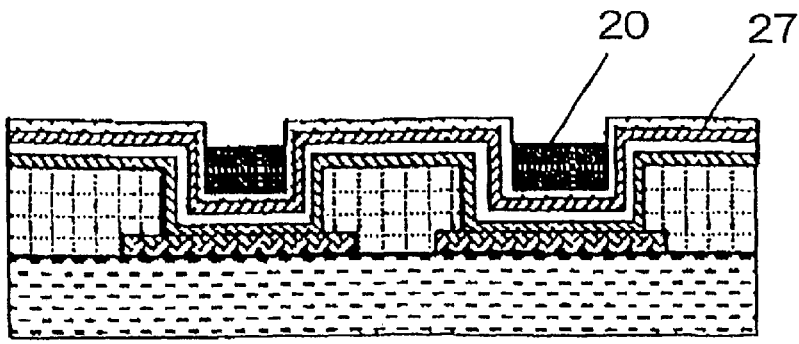

Then, the resist 20 is etched in such a manner that the resist 20 remains only in the via-hole 23a, as illustrated in FIG. 6E. If the resist 20 is composed of positive type photosensitive resin, the resist 20 is exposed to light and developed in accordance with the photolithography process so that the resist 20 remains only in the via-hole 23a.

Figure 6F:
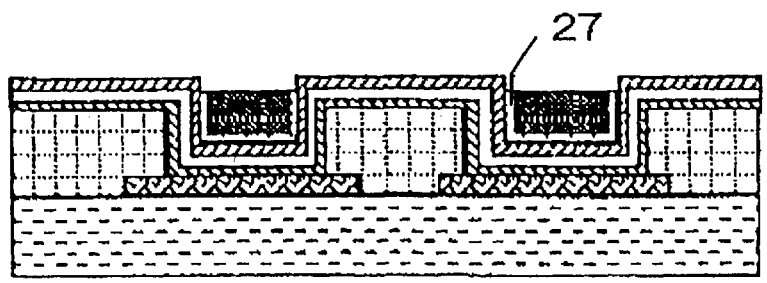

Then, as illustrated in FIG. 6F, the third electrically conductive thin layer 27 is etched through the use of acid in a region other than the via-hole 23a.

Figure 6G:
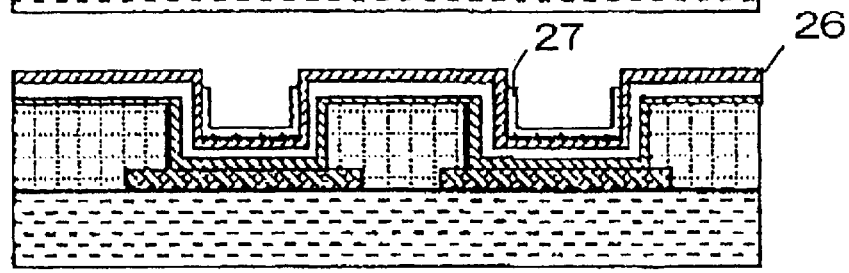

Then, as illustrated in FIG. 6G, the resist 20 remaining in the via-hole 23a is removed through the use of organic solvent. Since the third electrically conductive thin layer 27 remaining in the via-hole 23a has a resistance at a surface thereof which resistance is different from a resistance of the second electrically conductive thin layer 26 at a surface thereof, that is, electric resistances inside and outside the via-hole 23a are different from each other, it is possible to control an area where a first metal film 28 is to be deposited.

Figure 6H:
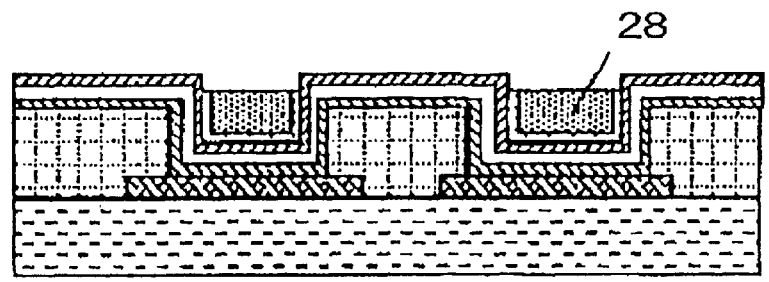

Then, there is carried out electroplating to thereby deposit a first metal film 28 only in the via-hole 23a, as illustrated in FIG. 6H. As mentioned above, since the second electrically conductive thin layer 26 has a higher resistance than that of the third electrically conductive layer 27 located in the via-hole 23a, and is planarized, the first metal film 28 is quite difficult to be deposited on the second electrically conductive layer 26. Accordingly, the first metal film 28 is deposited only in the via-hole 23a in which the third electrically conductive layer 27 remains.

The first metal film 28 is composed preferably of copper in view of fabrication cost. As an alternative, the first metal film 28 may be composed of silver having a small electric resistance, or metals which can be electroplating, such as gold, iron, nickel, tin, platinum, palladium and zinc, and an alloy thereof.

Figure 6I:
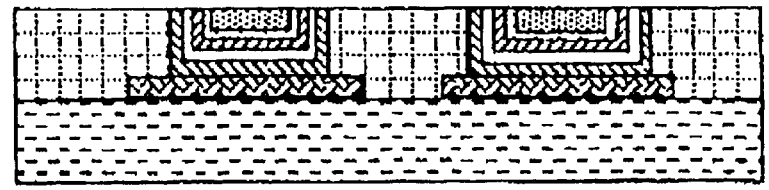

Then, the dielectric layer 24, the first and second electrically conductive layers 25 and 26, and the first metal film 28 are all polished by buff-polishing in a region other than the via-hole 23a. Thus, as illustrated in FIG. 6I, a resultant thin film capacitor is planarized at a surface thereof. If the dielectric layer 24 and the first and second electrically conductive layers 25 and 26 can be etched, they may be removed by etching. After planarization, a product is washed, and thus, there is completed the thin film capacitor through the method in accordance with the first embodiment.

By planarizing a resultant thin film capacitor at a surface thereof, a thin film capacitor can formed between layers. In addition, by controlling a thickness of the first metal film 28, it is possible for a resultant thin film capacitor to have a planarized surface. Thus, it would be possible to form a circuit or another thin film capacitor on the thus fabricated thin film capacitor having a planarized surface. It is also possible to concurrently form a plurality of thin film capacitors in a common layer.

Hereinbelow is explained a detailed example of the above-mentioned first embodiment.

In the example, there was used a glass-fiber reinforced organic substrate as the substrate 21, and the insulating layer 23 was composed of a material commercially available from Shin-nittetsu Kagaku Co. Ltd. in the tradename of "V-259PA" including epoxy acrylate resin having negative type fluorene skeleton, as main ingredient.

First, the above-mentioned negative type epoxy acrylate resin was coated on the substrate 21 by a thickness of 10 μm by means of a spin-coater, and then, heated at 75 degrees centigrade for 40 minutes. Thereafter, the resin was exposed to light at 800 mJ/cm$^2$, and cured at 200 degrees centigrade for 40 minutes in nitrogen gas atmosphere, to thereby form an insulating layer on the substrate 21.

Then, a thin titanium film for adhesion and a thin copper film for power-feeding were deposited on the insulating layer in this order by sputtering. In sputtering, a chamber in which the substrate 21 was laid was made vacuous to $1 \times 10^{-7}$ Torr, and then, to $4 \times 10^{-3}$ Torr by introducing argon into the chamber. Then, the thin titanium film was deposited at 5 A of a current applied thereto and at a trace speed of 300 mm/min, and the copper film was deposited at 4 A of a current applied thereto and at a trace speed of 300 mm/min. The thin titanium film was 100 nm thick, and the thin copper film was 220 nm thick.

Then, positive type photoresist commercially available from Tokyo Ohak Kogyo Co. Ltd. in the tradename "P-LA900PM" was coated on the power-feeding film by a thickness of 10 μm by means of a spin-coater, and then, heated at 90 degrees centigrade for 30 minutes. Then, the power-feeding film was exposed to light at 600 mJ/cm$^2$ through the use of a photomask which was patterned into a shape of the lower electrode, and developed by dipping the power-feeding film into alkaline developing agent for 6 minutes. Thus, the power-feeding film was patterned.

Then, there was carried out copper electroplating at 0.6 A for 12 minutes in sulfuric acid bath to thereby deposit copper in a via-hole or recess in the pattern. Thereafter, the photoresist was roughly removed by organic solvent, and ashed at 45 degrees centigrade for 3 minutes in oxygen plasma to thereby completely remove the photoresist.

The copper and titanium films not constituting the lower electrode were removed by etching. Thus, there was formed the lower electrode 22 as illustrated in FIG. 6A.

After the formation of the lower electrode 22, the above-mentioned material "V-259PA" was coated over both the lower electrode 22 and the substrate 21 by a thickness of 20 μm by means of a spin-coater. The thus coated material "V-259PA" was heated at 75 degrees centigrade for 40 minutes, exposed to light at 200 mJ/cm$^2$, and developed by dipping into 1%-sodium carbonate aqueous solution for 4 minutes, to thereby form a via-hole therein. Then, epoxy acrylate resin residual in the via-hole was ashed for removal at 45 degrees centigrade for 2 minutes in oxygen plasma.

Then, the epoxy acrylate resin "V-259PA" was heated at 200 degrees centigrade for 30 minutes in nitrogen gas atmosphere to thereby be cured. Thus, here was formed the insulating layer 23 patterned in such a fashion as illustrated in FIG. 6B.

Then, as illustrated in FIG. 6C, the dielectric film 24, the first electrically conductive thin layer 25, the second electrically conductive thin layer 26, and the third electrically conductive thin layer 27 were formed over the insulating layer 23 and the lower electrode 22 by sputtering. The dielectric film 24 was composed of titanium oxide, the first and third electrically conductive thin layers 25 and 27 were composed of copper, and the second electrically conductive thin layer 26 was composed of titanium.

In sputtering of the dielectric film 24, a chamber in which the substrate 21 was laid was made vacuous to $1 \times 10^{-7}$ Torr, and then, to $3 \times 10^{-3}$ Torr by introducing argon and oxygen into the chamber. Then, the dielectric film 24 was deposited at 8 A of a current applied thereto and at a trace speed of 100 mm/min. The dielectric film 24 was 100 nm thick. In sputtering of the second electrically conductive thin layer 26, a chamber in which the substrate 21 was laid was made vacuous to $1 \times 10^{-7}$ Torr, and then, to $4 \times 10^{-3}$ Torr by introducing argon into the chamber. Then, the second electrically conductive thin layer 26 was deposited at 5 A of a current applied thereto and at a trace speed of 300 mm/min. The second electrically conductive thin layer 26 was 100 nm thick. In sputtering of the first and third electrically conductive thin layers 25 and 27, a chamber in which the substrate 21 was laid was made vacuous to $1 \times 10^{-7}$ Torr, and then, to $4 \times 10^{-3}$ Torr by introducing argon into the chamber. Then, the first and third electrically conductive thin layers 25 and 27 were deposited at 4 A of a current applied thereto and at a trace speed of 300 mm/min. The first and third electrically conductive thin layers 25 and 27 were 220 nm thick.

Then, as illustrated in FIG. 6D, the resist 20 was deposited all over the third electrically conductive thin layer 27. As the resist 20, there was used positive type photoresist commercially available from Tokyo Ohak Kogyo Co. Ltd. in the tradename "P-LA900PM". The resist 20 was coated on the third electrically conductive layer 27 by a thickness of 10 μm by means of a spin-coater, and then, heated at 90 degrees centigrade for 30 minutes. Then, the resist 20 was exposed to light at 240 mJ/cm$^2$ through the use of a photomask, and developed by dipping the resist 20 into alkaline developing agent for 6 minutes. Thus, as illustrated in FIG. 6E, the resist 20 remained only in the via-hole 23a.

Then, as illustrated in FIG. 6F, the third electrically conductive thin layer 27 was etched through the use of acid in a region other than the via-hole 23a.

Then, as illustrated in FIG. 6G, the resist 20 remaining in the via-hole 23a was roughly removed through the use of organic solvent. Thereafter, the resist 20 remaining in the via-hole 23a was ashed at 45 degrees centigrade for 4 minutes in oxygen plasma to thereby completely remove the resist 20. While the resist 20 was ashed for removal, an exposed portion of the second electrically conductive thin layer 26 composed of titanium was also oxidized. By oxidizing an exposed portion of the second electrically conductive thin layer 26, the second electrically conductive thin layer 26 can have a higher electric resistance, and also have higher insolubility to acid. A portion of the second electrically conductive thin layer 26, covered with the third electrically conductive thin layer 27 in the via-hole 23a, was not oxidized, and the third electrically conductive thin layer 27 was not caused to have a higher resistance.

Then, there was carried out copper electroplating to the substrate in sulfuric acid bath at 0.6 A for 30 minutes to thereby deposit the first metal film 28 only in the via-hole 23a, as illustrated in FIG. 6H. The first metal film 28 was composed of copper.

Then, the product was polished with a buff No. 1000 to thereby planarize the upper electrode, as illustrated in FIG. 6I. Though copper was deposited in the form of particles on the second electrically conductive thin layer 26 composed of oxidized titanium during copper plating, it was confirmed by the experiments that the copper deposited on the second electrically conductive thin layer 26 could be completely removed in the buff-polishing step.

Since the thus fabricated thin film capacitor has a planarized upper surface, it would be possible to fabricate a multi-layered wiring structure.

Figure 7:
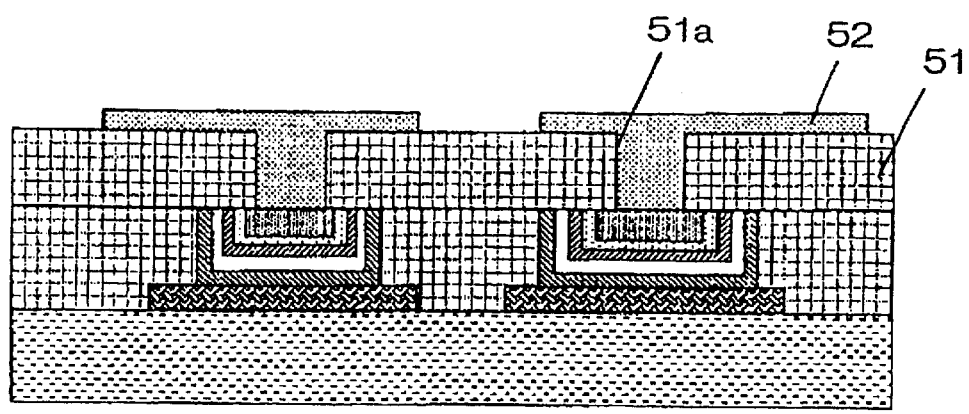
FIG. 7 is a cross-sectional view of a multi-layered wiring structure including the thin film capacitor in accordance with a variant of the first embodiment of the present invention.

FIG. 7 illustrates an example of such a multi-layered wiring structure. A second insulating layer 51 is formed over the thin film capacitor. The second insulating layer 51 is formed with a second via-hole 51a reaching upper electrode 28. An upper wiring layer 52 is formed on the second insulating layer 51 and makes electrical contact with the upper electrode 28 through the second via-hole 51a filled with metal.

In the multi-layered wiring structure illustrated in FIG. 7, though the second via-hole 51a is entirely filled with metal, the second via-hole 51a is not always filled with metal. For instance, the metal may be uniformly deposited in a vertical direction in the via-hole 51a.

The lower electrode 22 may be designed to have raised and recessed portions at a surface thereof in order to accomplish a desired capacity in a limited surface area. If the lower electrode 22 is designed to have raised and recessed portions in a conventional thin film capacitor, the capacitor would be accompanied with a problem that the capacitor could not be planarized at an upper surface thereof, and hence, it would be difficult to fabricate a multi-layered wiring structure based on the capacitor. In contrast, since the thin film capacitor in accordance with the present invention has a buried structure in which the upper electrode 28 is completely buried in the insulating film 23, it would be possible to planarize the upper electrode 28, and hence, fabricate a multi-layered wiring structure, even if the lower electrode 22 had raised and recessed portions at a surface thereof.

[Second Embodiment]

Figure 5:
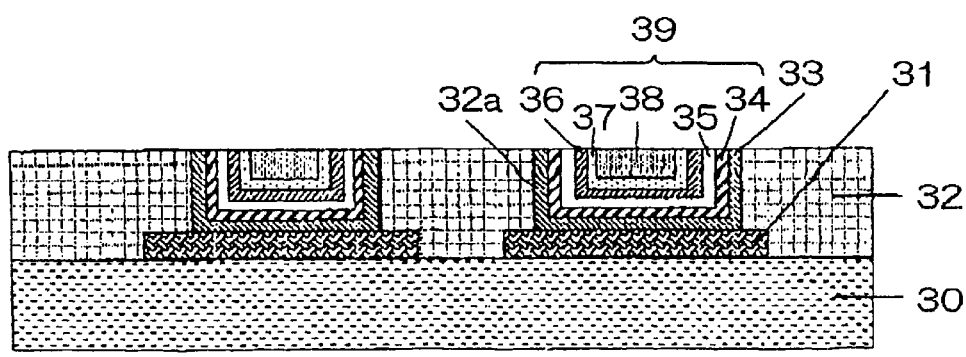
FIG. 5 is a cross-sectional view of a thin film capacitor fabricated by the method in accordance with the third embodiment of the present invention.

FIG. 5 is a cross-sectional view of the thin film capacitor fabricated by the method in accordance with second embodiment of the present invention.

The illustrated thin film capacitor is comprised of a lower electrode 31 formed on a substrate 30, an insulating layer 32 formed burying the lower electrode 31 therein and formed with a via-hole 32a reaching the lower electrode 31, a dielectric layer 33 formed on an inner sidewall of the via-hole 32a and covering an exposed surface of the lower electrode 31 therewith, and an upper electrode 39 surrounded by the dielectric layer 33.

The upper electrode 39 is comprised of a four-layered structure 34–37 and a first metal film 38 surrounded by the three-layered structure 34–37 in the via-hole 32a. The four-layered structure includes a first electrically conductive layer 34, a second electrically conductive layer 35 formed on the first electrically conductive layer 34, a third electrically conductive layer 36 formed on the second electrically conductive layer 35, and a fourth electrically conductive layer 37 formed on the third electrically conductive layer 36.

FIGS. 8A to 8I illustrates respective steps of the method of fabricating the thin film capacitor illustrated in FIG. 5. The second embodiment is structurally different from the first embodiment in a structure of the electrically conductive thin layers constituting the upper electrode.

Figure 8A:
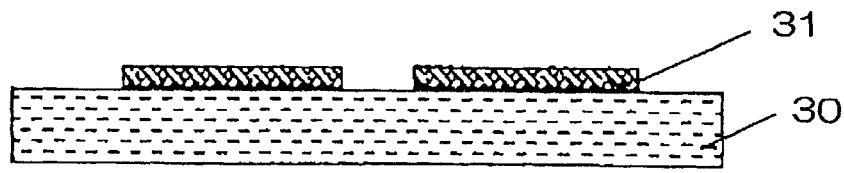
FIGS. 8A to 8I are cross-sectional views of a thin film capacitor, each illustrating respective step of a method of fabricating the thin film capacitor in accordance with the second embodiment of the present invention.

First, as illustrated in FIG. 8A, a lower electrode 31 is formed on a substrate 30.

Figure 8B:
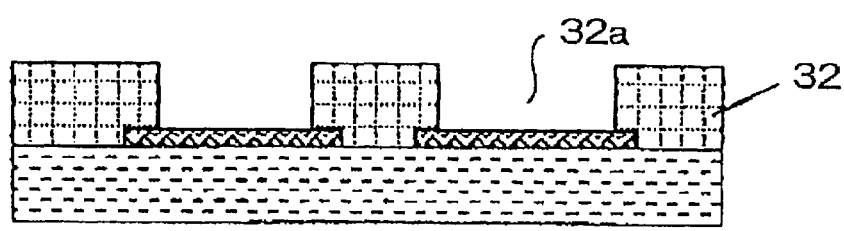

Then, an insulating layer 32 is formed all over the substrate 30 and the lower electrode 31. Then, the insulating layer 23 is patterned by photolithography and etching or through the use of laser. Thus, there is formed a via-hole or recess 32a throughout the insulating layer 32, as illustrated in FIG. 8B. A capacity of a resultant capacitor is dependent on a size of the via-hole 32a. It is preferable that the lower electrode 31 is formed so as to have a width greater than a width of the via-hole 32a, which ensures that the lower electrode 31 is covered at opposite ends with the insulating layer 32 and that short-circuit between the lower electrode 31 and a later formed upper electrode can be prevented.

A wiring layer or the insulating layer 32 may be formed on the substrate 30 prior to the formation of the lower electrode 31.

Then, a dielectric layer 33 is formed over both the insulating layer 32 and the lower electrode 31 by sputtering, evaporation, CVD or anodic oxidation. For instance, the dielectric layer 33 is composed of titanium oxide, tantalum oxide, $Al_2O_3$, $SiO_2$, $Nb_2O_5$, and perovskite family materials such as BST ($Ba_XSr_{1-X}TiO_3$), PZT ($PbZr_XTi_{1-X}O_3$), PLZT ($Pb_{1-Y}La_YZr_XTi_{1-X}O_3$) and $SrBi_2Ta_2O_9$ wherein $0 \leq X \leq 1$ and $0 < Y < 1$. As an alternative, the dielectric layer 33 may be composed of organic resin which is capable of accomplishing a desired dielectric constant.

Figure 8C:
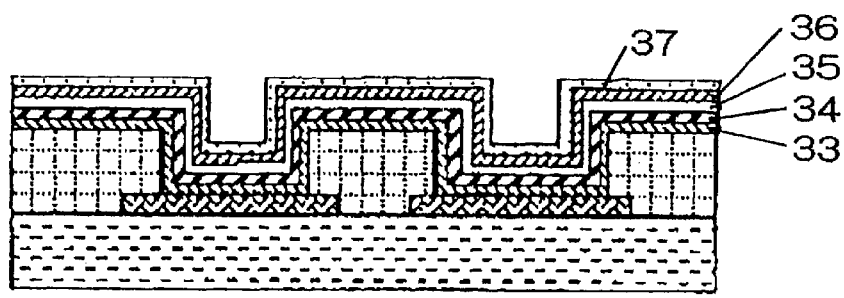

Then, as illustrated in FIG. 8C, the first, second, third and fourth electrically conductive thin layers 34, 35, 36 and 37 are formed in this order by sputtering, evaporation or CVD.

The first electrically conductive thin layer 34 is required to provide adhesion with an underlying layer and act as a barrier for the dielectric layer 33. Hence, the first electrically conductive thin layer 34 is composed preferably of transition metals belonging to IVa group, Va group or VIa group, such as titanium, niobium, tantalum, tungsten and chromium. The second electrically conductive thin layer 35 is composed preferably of a metal which is capable of uniformizing a voltage during plating. For instance, the second electrically conductive thin layer 35 is composed preferably of copper or silver, because they have a small electric resistance. As an alternative, the second electrically conductive thin layer 35 may be aluminum or transition metals belonging to VIIIa group or Ib group, such as palladium, gold and platinum. The third electrically conductive thin layer 36 is composed preferably of a metal having high resistance to acid in view of subsequent steps. For instance, the third electrically conductive thin layer 36 is composed preferably of transition metals belonging to IVa group, Va group or VIa group, such as titanium, niobium, tantalum, tungsten and chromium. The fourth electrically conductive thin layer 37 is composed preferably of a metal having small electric resistance. For instance, the fourth electrically conductive thin layer 37 is composed preferably of copper or silver. As an alternative, the fourth electrically conductive thin layer 37 may be composed of aluminum or transition metals belonging to VIIIa group or Ib group, such as palladium, gold and platinum.

Figure 8D:
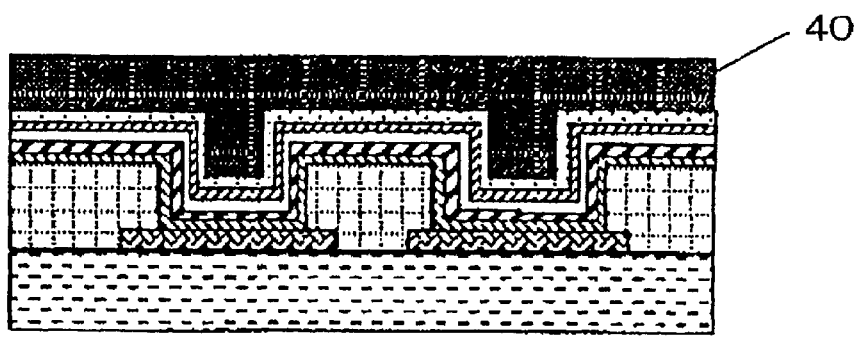

Then, as illustrated in FIG. 8D, resist 40 is deposited over the fourth electrically conductive thin layer 37.

Figure 8E:
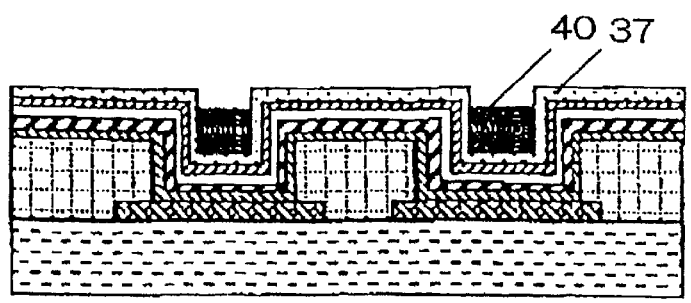

Then, the resist 40 is etched in such a manner that the resist 40 remains only in the via-hole 32a, as illustrated in FIG. 8E.

Figure 8F:
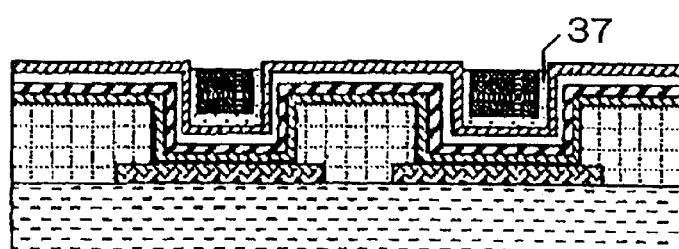

Then, as illustrated in FIG. 8F, the fourth electrically conductive thin layer 37 is etched through the use of acid in a region other than the via-hole 32a.

Figure 8G:
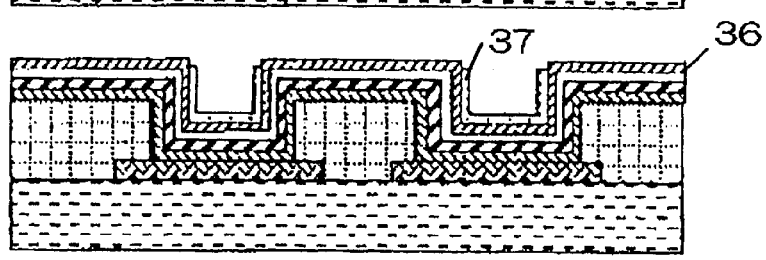

Then, as illustrated in FIG. 8G, the resist 40 remaining in the via-hole 32a is removed through the use of organic solvent. Since the fourth electrically conductive thin layer 37 remaining in the via-hole 32a has a resistance at a surface thereof which resistance is different from a resistance of the exposed third electrically conductive thin layer 36 at a surface thereof, that is, electric resistances inside and outside the via-hole 32a are different from each other, it is possible to control an area where a first metal film 38 is to be deposited.

Figure 8H:
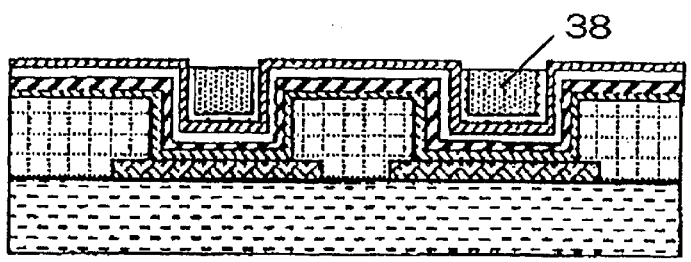

Then, there is carried out electroplating to thereby deposit a first metal film 38 only in the via-hole 32a, as illustrated in FIG. 8H. As mentioned above, since the third electrically conductive thin layer 36 has a higher resistance than that of the fourth electrically conductive layer 37 located in the via-hole 32a, and is planarized, the first metal film 38 is quite difficult to be deposited on the third electrically conductive layer 36. Accordingly, the first metal film 38 is deposited only in the via-hole 32a in which the fourth electrically conductive layer 37 remains.

The first metal film 38 is composed preferably of copper in view of fabrication cost. As an alternative, the first metal film 38 may be composed of silver having a small electric resistance, or metals which can be electrolytically plated, such as gold, iron, nickel, tin, platinum, palladium and zinc, and an alloy thereof.

Figure 8I:
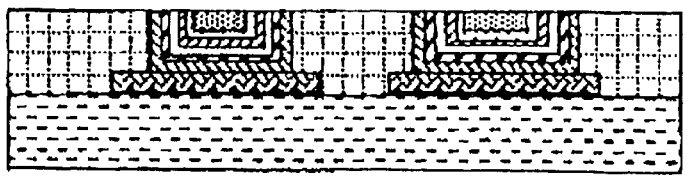

Then, the dielectric layer 33, the first, second and third electrically conductive layers 34, 35 and 36, and the first metal film 38 are all polished by buff-polishing in a region other than the via-hole 32a. Thus, as illustrated in FIG. 8I, a resultant thin film capacitor is planarized at an upper surface thereof. If the dielectric layer 33 and the first to third electrically conductive layers 34–36 can be etched, they may be removed by etching. After planarization, a product is washed, and thus, there is completed the thin film capacitor through the method in accordance with the second embodiment.

Hereinbelow is explained a detailed example of the above-mentioned second embodiment.

In the example, there was used a glass-fiber reinforced organic substrate as the substrate 30, and the insulating layer 32 was composed of a material commercially available from Shin-nittetsu Kagaku Co. Ltd. in the tradename of "V-259PA" including epoxy acrylate resin having negative type fluorene skeleton, as main ingredient.

First, the lower electrode 31 was formed on the substrate 30 in the same way as the first embodiment, as illustrated in FIG. 8A.

After the formation of the lower electrode 31, the insulating layer 32 was formed over the substrate 30 and the lower electrode 31 in the same way as the first embodiment. Then, the insulating layer 32 was patterned in the same was as the first embodiment, to have the via-hole 32a reaching the lower electrode 31.

Then, as illustrated in FIG. 8C, the dielectric film 33, the first electrically conductive thin layer 34, the second electrically conductive thin layer 35, the third electrically conductive thin layer 36 and the fourth electrically conductive layer 37 were formed over the insulating layer 32 and the lower electrode 31 by sputtering. The dielectric film 24 was composed of titanium oxide, the first and third electrically conductive thin layers 34 and 36 were composed of titanium, and the second and fourth electrically conductive thin layers 35 and 37 were composed of copper.

The dielectric film 33 was deposited in the same way as the first embodiment. In sputtering of the first and third electrically conductive thin layers 34 and 36, a chamber in which the substrate 30 was laid was made vacuous to $1\times10^{-7}$ Torr, and then, to $4\times10^{-3}$ Torr by introducing argon into the chamber. Then, the first and third electrically conductive thin layers 34 and 36 were deposited at 5 A of a current applied thereto and at a trace speed of 300 mm/min. The first and third electrically conductive thin layers 34 and 36 were 100 nm thick. In sputtering of the second and fourth electrically conductive thin layers 35 and 37, a chamber in which the substrate 30 was laid was made vacuous to $1\times10^{-7}$ Torr, and then, to $4\times10^{-3}$ Torr by introducing argon into the chamber. Then, the second and fourth electrically conductive thin layers 35 and 37 were deposited at 4 A of a current applied thereto and at a trace speed of 300 mm/min. The second and fourth electrically conductive thin layers 35 and 37 were 220 nm thick.

Then, as illustrated in FIG. 8D, the resist 40 was deposited all over the fourth electrically conductive thin layer 37. As the resist 40, there was used positive type photoresist commercially available from Tokyo Ohak Kogyo Co. Ltd. in the tradename "P-LA900PM". The resist 40 was coated on the fourth electrically conductive layer 37 by a thickness of 10 μm by means of a spin-coater, and then, heated at 90 degrees centigrade for 30 minutes. Then, the fourth electrically conductive layer 37 was exposed to light at 240 mJ/cm$^2$ through the use of a photomask, and developed by dipping into alkaline developing agent for 6 minutes. Thus, as illustrated in FIG. 8E, the resist 40 remained only in the via-hole 32a.

Then, as illustrated in FIG. 8F, the fourth electrically conductive thin layer 37 was etched through the use of acid in a region other than the via-hole 32a.

Then, as illustrated in FIG. 8G, the resist 40 remaining in the via-hole 32a was roughly removed through the use of organic solvent. Thereafter, the resist 40 remaining in the via-hole 32a was ashed at 45 degrees centigrade for 4 minutes in oxygen plasma to thereby completely remove the resist 40. While the resist 40 was ashed for removal, an exposed portion of the third electrically conductive thin layer 36 composed of titanium was also oxidized. By oxidizing an exposed portion of the third electrically conductive thin layer 36, the third electrically conductive thin layer 36 can have a higher electric resistance, and also have higher insolubility to acid. A portion of the third electrically conductive thin layer 36, covered with the fourth electrically conductive thin layer 37 in the via-hole 32a, was not oxidized, and the fourth electrically conductive thin layer 37 was not caused to have a higher resistance.

Then, there was carried out copper electroplating to the substrate in sulfuric acid bath at 0.6 A for 30 minutes to thereby deposit the first metal film 38 only in the via-hole 32a, as illustrated in FIG. 8H. The first metal film 38 was composed of copper.

Then, the product was polished with a buff No. 1000 to thereby planarize the upper electrode, as illustrated in FIG. 8I. Though copper was deposited in the form of particles on the third electrically conductive thin layer 36 composed of oxidized titanium during copper plating, it was confirmed by the experiments that the copper deposited on the third electrically conductive thin layer 36 could be completely removed in the buff-polishing step.

Since the thus fabricated thin film capacitor has a planarized upper surface, it would be possible to fabricate a multi-layered wiring structure, as having been explained with reference to FIG. 7.

[Third Embodiment]

Figures 1, 9:
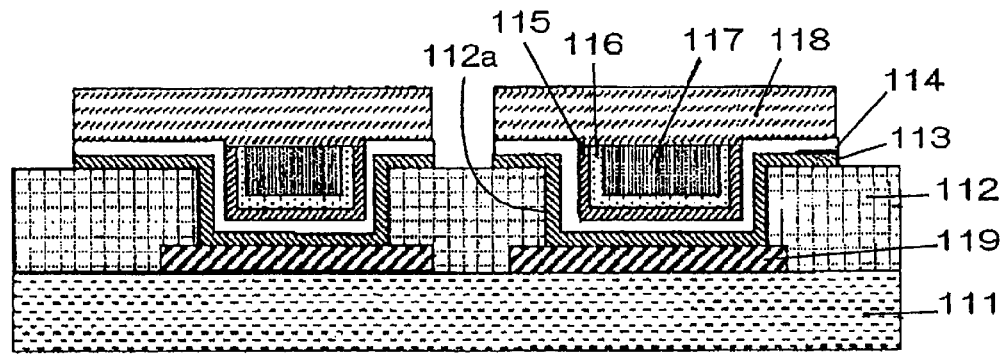
FIG. 9 is a cross-sectional view of a patterned structure fabricated through the method in accordance with the third embodiment of the present invention, with FIGS. 9-1 9-2 and 9-3 illustrating embodiments having more than four layers.
Figures 2, 9:
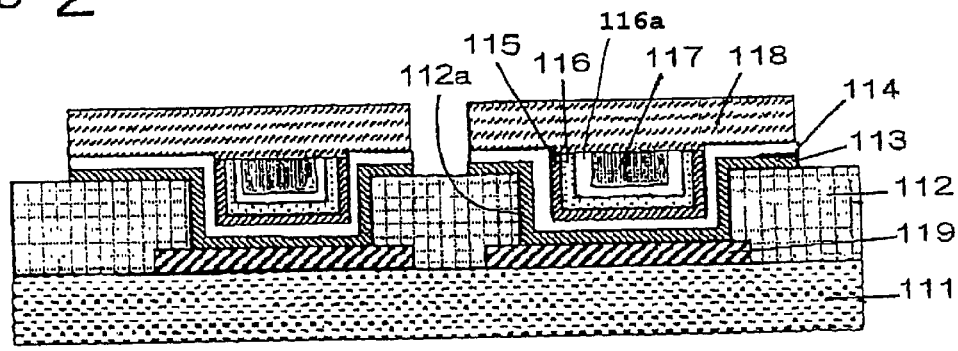
Figures 3, 9:
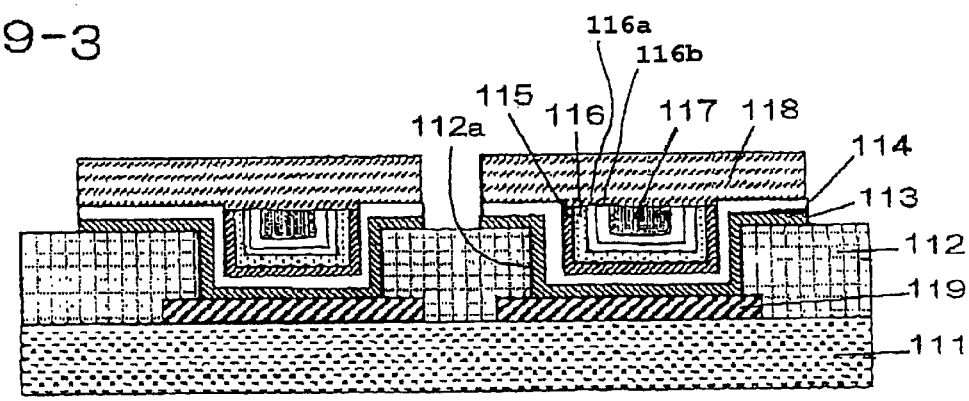

FIG. 9 is a cross-sectional view of a patterned structure fabricated through the method in accordance with the third embodiment of the present invention.

The illustrated patterned structure is comprised of a substrate 111, a lower pattern 119 formed on the substrate 111, an insulating resin layer 112 formed on the substrate 111 and formed with a via-hole 112a reaching the lower pattern 119, a four-layered electrically conductive film including a first electrically conductive thin layer 113 formed over both the insulating resin layer 112 and an exposed portion of the lower pattern 119, a second electrically conductive thin layer 114 formed on the first electrically conductive thin layer 113, a third electrically conductive thin layer 115 formed on the second electrically conductive thin layer 114, and a fourth electrically conductive thin layer 116 formed on the third electrically conductive thin layer 115, an internal electrical conductor 117 surrounded at a bottom and a sidewall thereof by the fourth electrically conductive thin layer 116, and an upper electrical conductor 118 formed on both the four-layered electrically conductive film and the internal electrical conductor 117.

The first and third electrically conductive thin layers 113 and 115 are composed of one or more of transition metals belonging to IVa, Va and VIa groups and alloys thereof, and the second and fourth electrically conductive thin layers 114 and 116 are composed of one or more of copper, silver, aluminum, and transition metals belonging to VIIIa and Ib groups.

FIGS. 10A to 10K are cross-sectional views of a patterned structure, each illustrating respective step of a method of fabricating the patterned structure, in accordance with the third embodiment of the present invention.

It should be noted that a lower pattern located below a via-hole is omitted in FIGS. 10A to 10K.

First, an insulating resin layer 121 is formed all over a substrate 120 composed of a material such as organic material, ceramic, alumina and silicon. If the insulating resin layer 121 is composed of liquid material, the liquid material is spread on the substrate 120 by spin-coating, die-coating, curtain-coating or printing. If the insulating resin layer 121 is composed of a dry film, a plurality of dry films is deposited on the substrate 120. Then, the insulating resin layer 121 is heated to thereby be cured.

Figure 10A:
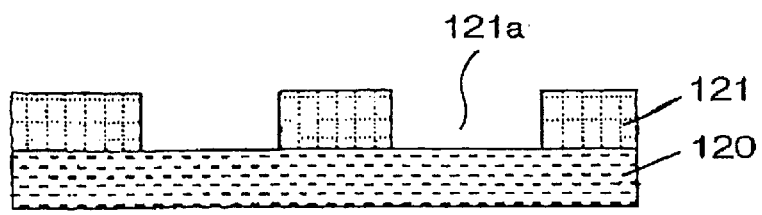
FIGS. 10A to 10K are cross-sectional views of a patterned structure, each illustrating respective step of a method of fabricating the patterned structure, in accordance with the third embodiment of the present invention, including embodiments having more than four layers.

Then, if the insulating resin layer 121 is composed of photosensitive resin, the insulating resin layer 121 is patterned by photolithography and etching. If the insulating resin layer 121 is composed of non-photosensitive resin, the insulating resin layer 121 is patterned through the use of laser. Thus, there is formed a via-hole or recess 121a throughout the insulating resin layer 121, as illustrated in FIG. 10A.

A lower wiring circuit or another via-hole may be formed on the substrate 120 prior to the formation of the insulating resin layer 121.

Figures 1, 10B:
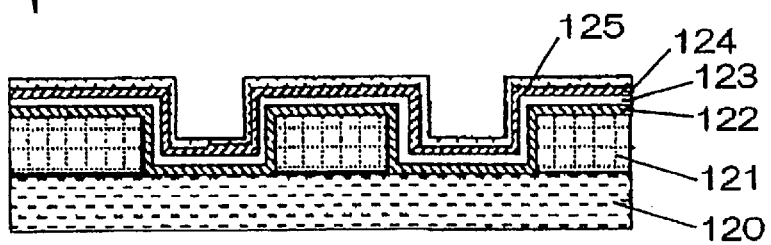
Figures 2, 10B:
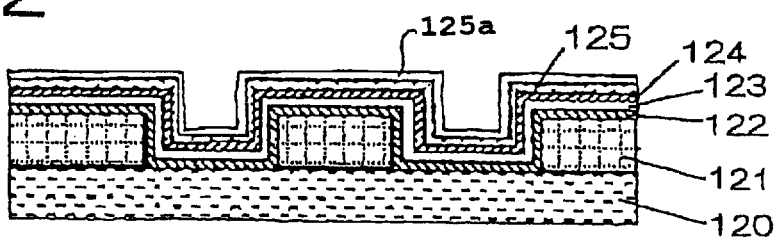
Figures 3, 10B:
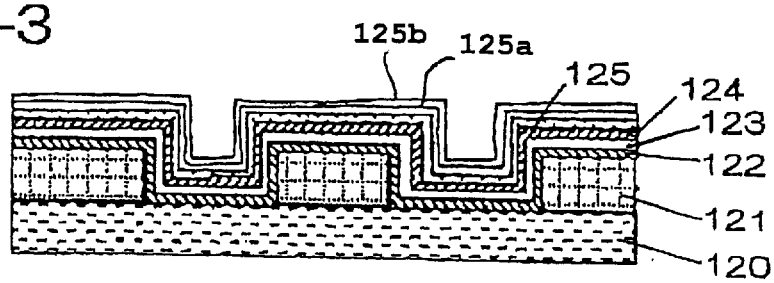

Then, as illustrated in FIG. 10B, first, second, third and fourth electrically conductive thin layers 122, 123, 124 and 125 are formed in this order over the insulating resin layer 121 and the substrate 120 by sputtering, evaporation or CVD.

The first electrically conductive thin layer 122 is composed preferably of a metal having high adhesion with the insulating resin layer 121. For instance, the first electrically conductive thin layer 122 is composed preferably of transition metals belonging to IVa group, Va group or VIa group, such as titanium, niobium, tantalum, molybdenum, chromium, and alloys thereof.

The second electrically conductive thin layer 123 is composed preferably of a metal which is capable of uniformizing a voltage during plating. For instance, the second electrically conductive thin layer 123 is composed preferably of copper or silver, because they have a small electric resistance. As an alternative, the second electrically conductive thin layer 123 may be composed of aluminum or transition metals belonging to VIIIa group or Ib group, such as palladium, gold and platinum.

The third electrically conductive thin layer 124 is composed preferably of a metal having high resistance to acid in view of subsequent steps. For instance, the third electrically conductive thin layer 124 is composed preferably of transition metals belonging to IVa group, Va group or VIa group, such as titanium, niobium, tantalum, tungsten and chromium.

The fourth electrically conductive thin layer 125 is composed preferably of a metal having small electric resistance. For instance, the fourth electrically conductive thin layer 125 is composed preferably of copper or silver. As an alternative, the fourth electrically conductive thin layer 125 may be composed of aluminum or transition metals belonging to VIIIa group or Ib group, such as palladium, gold and platinum.

Figure 10C:
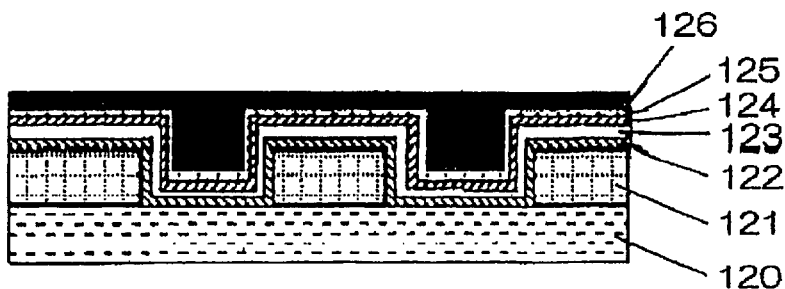

Then, as illustrated in FIG. 10C, resist 126 is deposited over the fourth electrically conductive thin layer 125. If the resist 126 is composed of liquid material, the liquid material is deposited on the fourth electrically conductive layer 126 by spin-coating, die-coating, curtain-coating or printing. If the resist 126 is composed of a dry film, a plurality of dry films is deposited on the fourth electrically conductive thin layer 126. Then, the resist 126 is heated to thereby be cured.

Figure 10D:
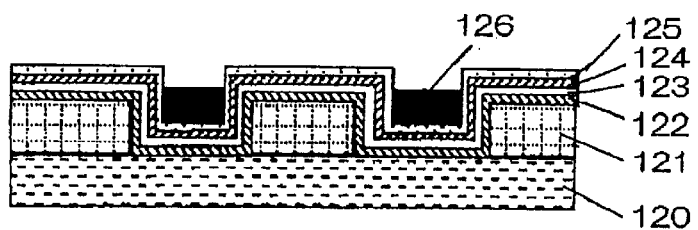

Then, the resist 126 is etched in such a manner that the resist 126 remains only in the via-hole 121a, as illustrated in FIG. 10D. If the resist 126 is composed of positive type photosensitive resin, the resist 126 is exposed to light and developed in accordance with the photolithography process so that the resist 126 remains only in the via-hole 121a.

In the step of exposing the resist 126 to light in the photolithography process, it is not necessary to use a photomask such as a chromium mask for forming a pattern including a via-hole having a small area. In contrast, it would be necessary to use a photomask for forming a pattern including a via-hole having a large area, in order to make the resist 126 residual in the via-hole 121a.

Figure 10E:
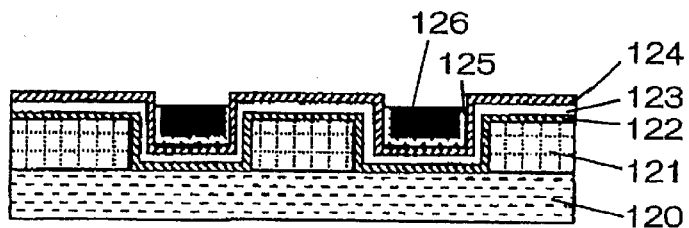

Then, as illustrated in FIG. 10E, the fourth electrically conductive thin layer 125 is etched through the use of acid in a region other than the via-hole 121a.

Figure 10F:
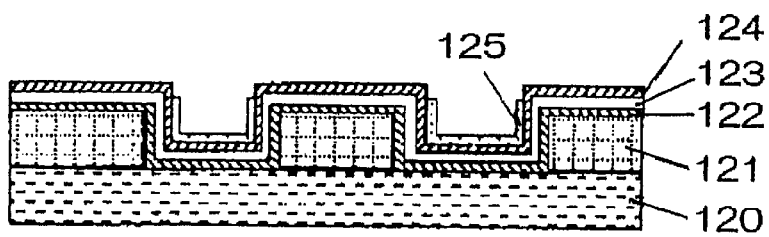

Then, as illustrated in FIG. 10F, the resist 126 remaining in the via-hole 121a is removed through the use of organic solvent. Since the fourth electrically conductive thin layer 125 remaining in the via-hole 121a has a resistance at a surface thereof which resistance is different from a resistance of the third electrically conductive thin layer 124 at a surface thereof, that is, electric resistances inside and outside the via-hole 121a are different from each other, it is possible to control an area where a later mentioned first metal film 127 is to be deposited.

Figure 10G:
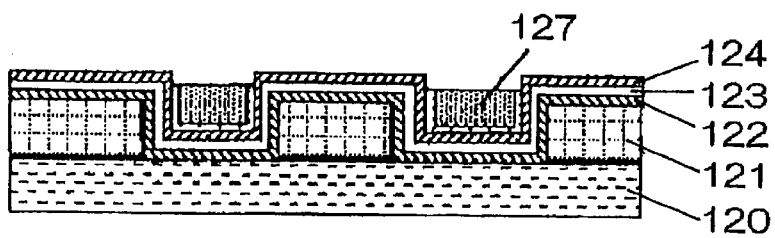

Then, there is carried out electroplating to thereby deposit a first metal film 127 only in the via-hole 121a, as illustrated in FIG. 10G. As mentioned above, since the third electrically conductive thin layer 124 has a higher resistance than that of the fourth electrically conductive thin layer 125 located in the via-hole 121a, and is planarized, the first metal film 127 is quite difficult to be deposited on the third electrically conductive thin layer 124. Accordingly, the first metal film 127 is deposited only in the via-hole 121a in which the fourth electrically conductive layer 125 remains.

The first metal film 127 is composed preferably of copper in view of fabrication cost. As an alternative, the first metal film 127 may be composed of silver having a small electric resistance, or metals which can be electroplating plated, such as gold, iron, nickel, tin, platinum, palladium and zinc, and an alloy thereof.

Figure 10H:
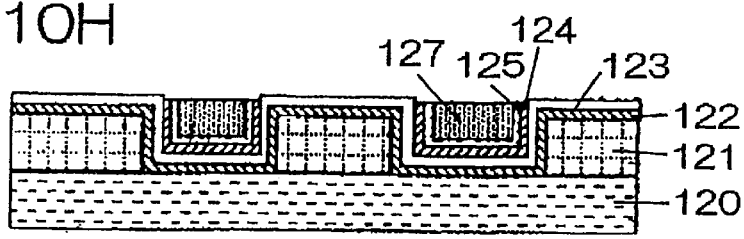

Then, as illustrated in FIG. 10H, the exposed third electrically conductive thin layer 124 is etched for removal to thereby expose the second electrically conductive thin layer 123.

Then, a resist 128 is deposited all over a product. If the resist 128 is composed of liquid material, the liquid material is deposited on the product by spin-coating, die-coating, curtain-coating or printing. If the resist 128 is composed of a dry film, a plurality of dry films is deposited on the product. Then, the resist 128 is heated to thereby be cured.

Figure 10I:
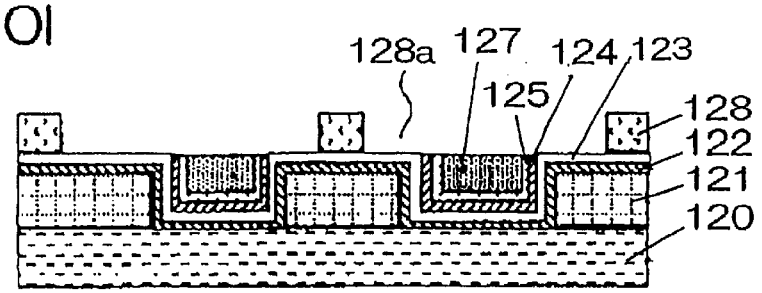

Then, the resist 128 is patterned by exposing to light and developed in accordance with the photolithography process so that the resist 128 is formed with a recess 128a by which the first metal film 127 is entirely exposed, as illustrated in FIG. 10I.

Figure 10J:
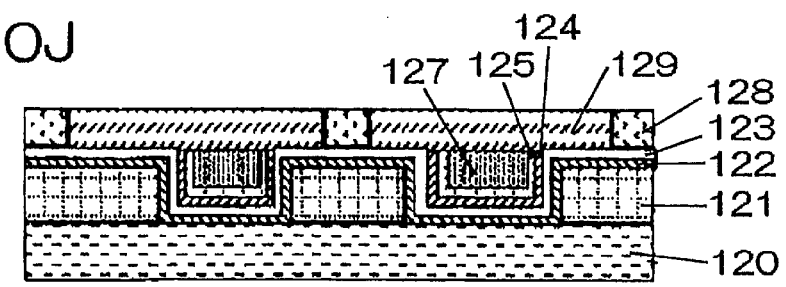

Then, as illustrated in FIG. 10J, there is carried out electroplating to thereby fill the recess 128a with a second metal film 129.

Figures 1, 10K:
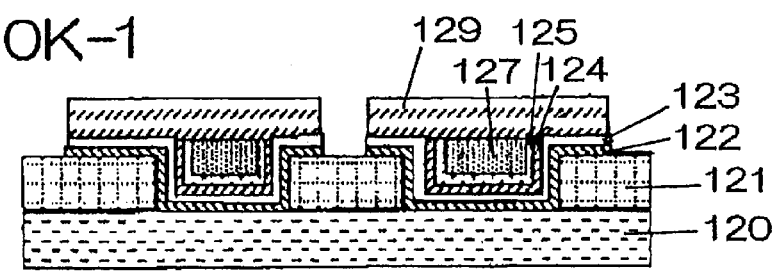
Figures 2, 10K:
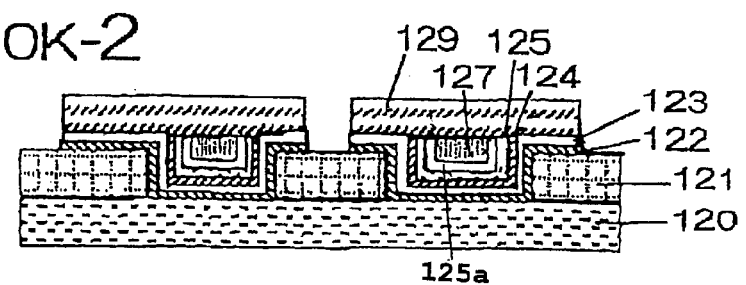
Figures 3, 10K:
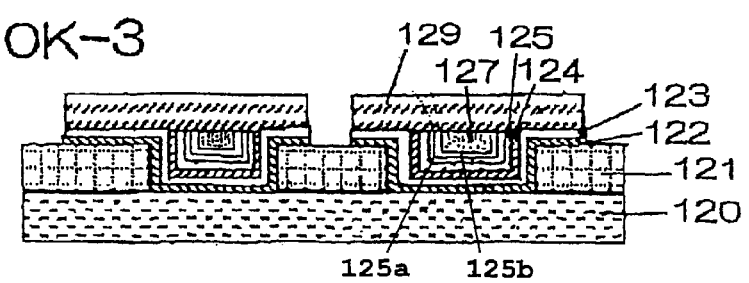

Then, as illustrated in FIG. 10K, the resist 128 is removed through the use of organic solvent, and subsequently, the third and second electrically conductive thin layers 23 and 22 are etched for removal with the second metal film 29 being used as a mask.

In accordance with the above-mentioned embodiment, it is possible to form a patterned structure in which a via-hole is entirely buried. It is also possible to fabricate a multi-layered wiring substrate by repeating the steps in the above-mentioned method. Since a via-hole is buried and is integral with a patterned formed thereabove, high reliability in electrical connection is ensured, and it is possible to form another via-hole above the previously formed via-hole.

Hereinbelow is explained a detailed example of the above-mentioned third embodiment.

In the example, there was used a glass-fiber reinforced organic substrate as the substrate 120, and the insulating layer 121 was composed of a material commercially available from Shin-nittetsu Kagaku Co. Ltd. in the tradename of "V-259PA" including epoxy acrylate resin having negative type fluorene skeleton, as main ingredient.

For instance, Japanese Unexamined Patent Publication No. 7-48424 has suggested to optically use epoxy acrylate resin having fluorene skeleton.

First, the above-mentioned negative type epoxy acrylate resin was coated on the substrate 120 by a thickness of 10 μm by means of a spin-coater, and then, heated at 75 degrees centigrade for 40 minutes. Thereafter, the resin was exposed to light at 200 mJ/cm$^2$, and developed by dipping into 1%-sodium carbonate aqueous solution for 4 minutes, to thereby form a via-hole 121a therein. Then, epoxy acrylate resin residual in the via-hole 121a was ashed for removal at 45 degrees centigrade for 2 minutes in oxygen plasma.

Then, the epoxy acrylate resin "V-259PA" was heated at 200 degrees centigrade for 30 minutes in nitrogen gas atmosphere to thereby be cured. Thus, there was formed the insulating resin layer 121 having the via-hole 121a, on the substrate 120, as illustrated in FIG. 10A.

Then, as illustrated in FIG. 10B, the first electrically conductive thin layer 122, the second electrically conductive thin layer 123, the third electrically conductive thin layer 124 and the fourth electrically conductive thin layer 125 were formed over the insulating resin layer 121 by sputtering. The first and third electrically conductive thin layers 122 and 124 were composed of titanium, and the second and fourth electrically conductive thin layers 123 and 125 were composed of copper.

In sputtering of the first and third electrically conductive thin layers 122 and 124, a chamber in which the substrate 120 was laid was made vacuous to $1 \times 10^{-7}$ Torr, and then, to $4 \times 10^{-3}$ Torr by introducing argon into the chamber. Then, the first and third electrically conductive thin layers 122 and 124 were deposited both at 5 A of a current applied thereto and at a trace speed of 300 mm/min. The first and third electrically conductive thin layers 122 and 124 were both 200 nm thick. The second electrically conductive thin layer 123 was twice deposited at 4 A of a current applied thereto and at a trace speed of 300 mm/min. The fourth electrically conductive thin layer 125 was deposited at 4 A of a current applied thereto and at a trace speed of 300 mm/min. The second electrically conductive thin layer 123 was 440 nm thick, and the fourth electrically conductive thin layer 125 was 220 nm thick. The reason why the second electrically conductive thin layer 123 was designed to be thicker than the fourth electrically conductive thin layer 125 was to avoid the lowermost layer, that is, the first electrically conductive thin layer 122 from being etched when the third electrically conductive thin layer 124 was to be etched in a later step.

Then, as illustrated in FIG. 10C, the resist 126 was deposited all over the fourth electrically conductive thin layer 125. As the resist 126, there was used positive type photoresist commercially available from Tokyo Ohak Kogyo Co. Ltd. in the tradename "P-LA900PM". The resist 126 was coated on the fourth electrically conductive layer 125 by a thickness of 10 μm by means of a spin-coater, and then, heated at 90 degrees centigrade for 30 minutes. Then, the resist 126 was exposed to light at 240 mJ/cm$^2$ without using a photomask, and developed by dipping the resist 126 into alkaline developing agent for 6 minutes. Thus, as illustrated in FIG. 10D, the resist 126 remained only in the via-hole 121a.

Then, as illustrated in FIG. 10E, the fourth electrically conductive thin layer 125 was etched through the use of acid in a region other than the via-hole 121a.

Then, the resist 126 remaining in the via-hole 121a was roughly removed by washing with organic solvent. Thereafter, the resist 126 remaining in the via-hole 121a was ashed at 45 degrees centigrade for 4 minutes in oxygen plasma to thereby completely remove the resist 126, as illustrated in FIG. 10F.

While the resist 126 was ashed for removal, an exposed portion of the third electrically conductive thin layer 124 composed of titanium was also oxidized. By oxidizing an exposed portion of the third electrically conductive thin layer 124, the third electrically conductive thin layer 124 can have a higher electric resistance, and also have higher insolubility to acid. A portion of the third electrically conductive thin layer 124, covered with the fourth electrically conductive thin layer 125 in the via-hole 121a, was not oxidized, and the second electrically conductive thin layer 123 was not caused to have a higher resistance.

Then, there was carried out copper electroplating to the substrate in sulfuric acid bath at 0.2 A for 20 minutes to thereby deposit the first metal film 127 only in the via-hole 121a, as illustrated in FIG. 10G. The first metal film 127 was composed of copper.

Then, the third electrically conductive thin layer 124 which has been exposed was etched for removal to thereby expose the second electrically conductive thin layer 123, as illustrated in FIG. 10H.

Then, the resist 128 was deposited all over the product. As the resist 128, there was used positive type photoresist commercially available from Tokyo Ohak Kogyo Co. Ltd. in the tradename "P-LA900PM". The resist 128 was coated on the product by a thickness of 10 μm by means of a spin-coater, and then, heated at 90 degrees centigrade for 30 minutes. Then, the resist 128 was exposed to light at 600 mJ/cm$^2$ through the use of a photomask, and developed by dipping the resist 128 into alkaline developing agent for 6 minutes. Thus, the resist 128 was patterned into such a pattern as illustrated in FIG. 10I, that is, the resist 128 was formed with the recess 128a.

Then, as illustrated in FIG. 10J, there was carried out copper electroplating at 1.2 A for 12 minutes in sulfuric acid bath to thereby fill the recess 128a with a second metal film 129.

Then, as illustrated in FIG. 10K, the resist 128 is roughly removed through the use of organic solvent, and subsequently, ashed at 45 degrees centigrade for 3 minutes in oxygen plasma to thereby completely remove the resist 128.

Thereafter, the third and second electrically conductive thin layers 123 and 122 were etched for removal in a region not covered with the second metal film 129, as illustrated in FIG. 10K.

Thus, it is possible to form a patterned structure in which a via-hole is entirely buried. It is also possible to fabricate a multi-layered wiring substrate by repeating the steps in the above-mentioned example.

When photolithography is carried out to fill a via-hole with a metal film, it is generally necessary to remove a resist in a predetermined region where a via-hole is to be formed, and to deposit metal in the region. However, in accordance with the above-mentioned example, it is possible to fill the via-hole 121a with the resist 126 without using a photomask. Thus, though dependent on a pattern size, it is possible to fill a via-hole with metal without using a mask, only by removing a resist in a predetermined region.

Accordingly, it would be possible to pattern a resist into a desired pattern without taking into consideration misregistration between a via-hole and a mask, caused by a bent of a substrate, for instance, and to prevent metal from being plated on an unnecessary portion.

[Fourth Embodiment]

FIGS. 11A to 11F are cross-sectional views of a patterned structure, each illustrating respective step of a method of fabricating the patterned structure, in accordance with the fourth embodiment of the present invention.

The fourth embodiment is different from the third embodiment with respect to formation of a second metal film as an upper pattern.

It should be noted that a lower pattern located below a via-hole is omitted in FIGS. 11A to 11F.

The steps in the third embodiment, having been explained with respect to FIGS. 10A to 10H(FIG. 11A), are carried out in the same way as the third embodiment. Then, resist 133 is deposited over the product. If the resist 133 is composed of liquid material, the liquid material is deposited on the product by spin-coating, die-coating, curtain-coating or printing. If the resist 133 is composed of a dry film, a plurality of dry films is deposited on the product. Then, the resist 133 is heated to thereby be cured.

Figure 11A:
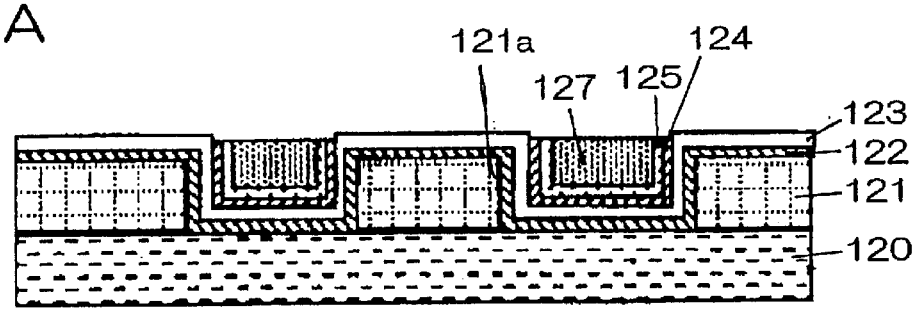
FIGS. 11A to 11F are cross-sectional views of a patterned structure, each illustrating respective step of a method of fabricating the patterned structure, in accordance with the fourth embodiment of the present invention.
Figure 11B:
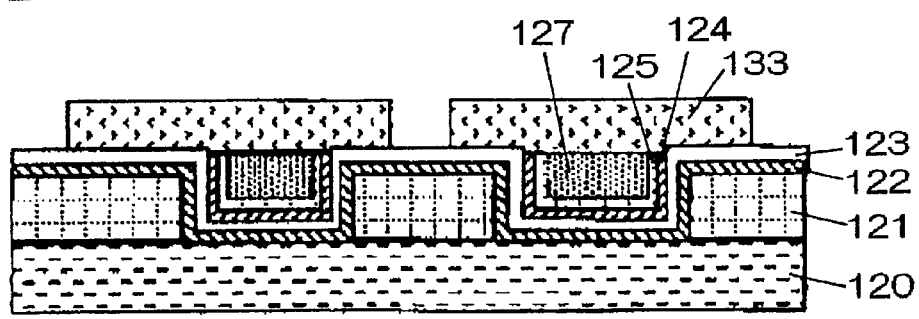

Then, the resist 133 is etched in such a manner that the resist 133 entirely covers the via-hole 121a therewith, as illustrated in FIG. 11B. If the resist 133 is composed of positive type photosensitive resin, the resist 133 is exposed to light and developed in accordance with the photolithography process so that the resist 133 entirely covers the via-hole 121a therewith.

Figure 11C:
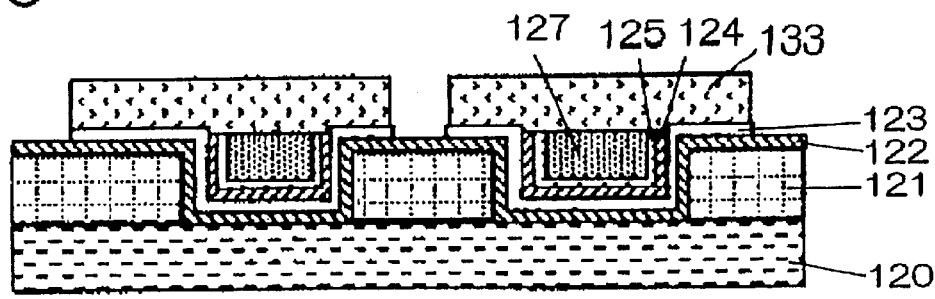

After the resist 133 has been patterned, the second electrically conductive thin layer 123 is etched through the use of acid in a region not covered with the resist 133, as illustrated in FIG. 11C.

Figure 11D:
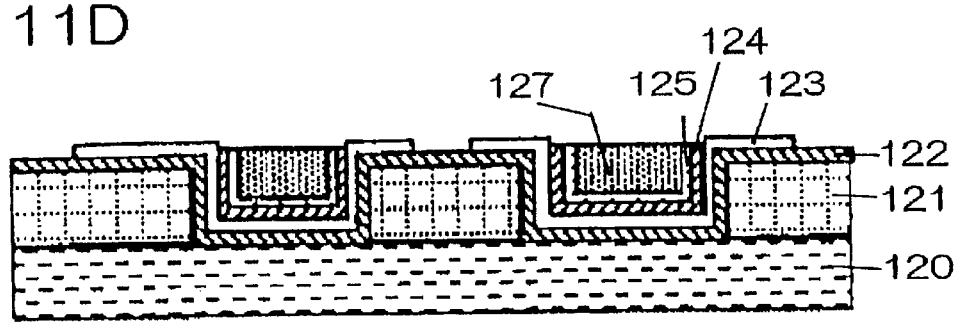

Then, the resist 133 is all removed through the use of organic solvent, as illustrated in FIG. 11D. Since the second electrically conductive thin layer 123 remaining around the via-hole 121a has a resistance at a surface thereof which resistance is different from a resistance of the exposed first electrically conductive thin layer 122 at a surface thereof, that is, electric resistances inside and outside the via-hole 121a are different from each other, it is possible to control an area where a second metal film 134 is to be deposited.

Figure 11E:
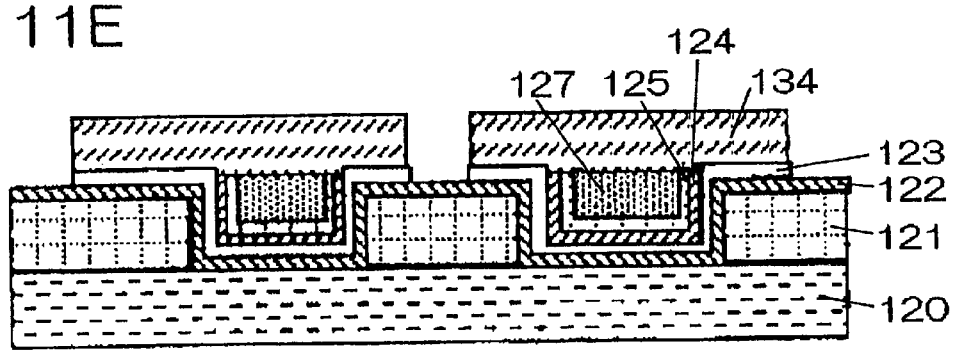

Then, there is carried out electroplating to thereby deposit the second metal film 134 on the first metal film 127 and the second to fourth electrically conductive thin layers 122 to 125, as illustrated in FIG. 11E. As mentioned above, since the first electrically conductive thin layer 122 having been exposed has a higher resistance than that of the second electrically conductive layer 123 located around the via-hole 121a, and is planarized, the second metal film 134 is quite difficult to be deposited on the first electrically conductive layer 122. Accordingly, the second metal film 134 is deposited only on the second electrically conductive thin layer 123, as illustrated in FIG. 11E.

The second metal film 134 is composed preferably of copper in view of fabrication cost. As an alternative, the second metal film 134 may be composed of silver having a small electric resistance, or metals which can be electroplating, such as gold, iron, nickel, tin, platinum, palladium and zinc, and an alloy thereof.

Figure 11F:
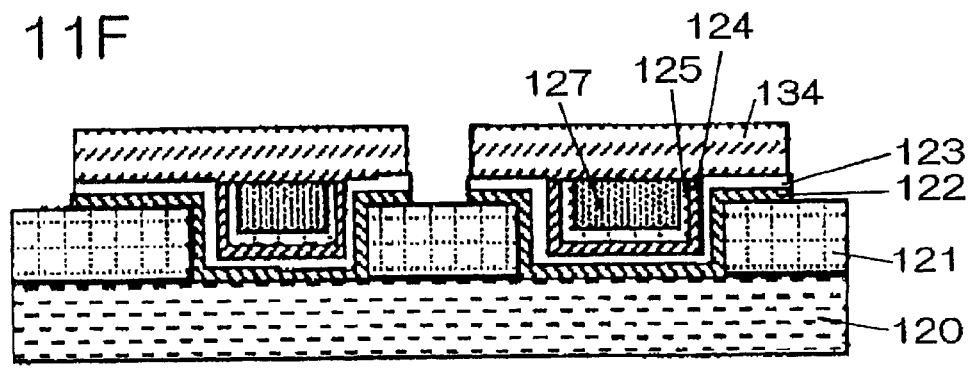

Thereafter, the first electrically conductive thin layer 122 is etched for removal in a region no covered with the second metal film 134, as illustrated in FIG. 11F.

If the second metal film 134 is deposited in deflection in the electroplating because of too high resistance of the first electrically conductive thin layer 122, a low-resistive thin metal film may be formed below the first electrically conductive thin layer 122. Such a low-resistive thin metal film would uniformize electric charges, it would be possible to prevent deflected deposition of the second metal film 134. When such a low-resistive thin metal film is to be formed, it is necessary to design the power-feeding layer to have a five- or more-layered structure.

Similarly to the third embodiment, it is also possible to fabricate a multi-layered wiring substrate by repeating the steps in the above-mentioned method.

Hereinbelow is explained a detailed example of the above-mentioned fourth embodiment.

It is now assumed that, as illustrated in FIG. 11A, the via-hole 121a was filled with the first metal film 127, and the third electrically conductive thin layer 124 was removed in a region other than the via-hole 121a in the same was as the example associated with the third embodiment.

Then, the resist 133 was deposited all over the product illustrated in FIG. 11A. As the resist 133, there was used positive type photoresist commercially available from Tokyo Ohak Kogyo Co. Ltd. in the tradename "P-LA900PM". The resist 133 was coated on the product by a thickness of 10 µm by means of a spin-coater, and then, heated at 90 degrees centigrade for 30 minutes. Then, the resist 133 was exposed to light at 600 mJ/cm$^2$ through the use of a photomask, and developed by dipping the resist 133 into alkaline developing agent for 6 minutes. Thus, the resist 133 was patterned into such a pattern as illustrated in FIG. 11B, that is, the resist 133 entirely covers the via-hole 121a therewith.

After the resist 133 has been patterned, the second electrically conductive thin layer 123 is etched through the use of acid in a region not covered with the resist 133 to thereby expose the first electrically conductive thin layer 122, as illustrated in FIG. 11C.

Then, the resist 133 is all removed through the use of organic solvent, as illustrated in FIG. 11D. Then, the residual resist 133 was ashed for complete removal at 45 degrees centigrade for 4 minutes in oxygen atmosphere. While the resist 133 was ashed for removal, an exposed portion of the first electrically conductive thin layer 122 composed of titanium was also oxidized. By oxidizing an exposed portion of the first electrically conductive thin layer 122, the first electrically conductive thin layer 122 can have a higher electric resistance, and also have higher insolubility to acid. A portion of the first electrically conductive thin layer 122, covered with the second electrically conductive thin layer 123, was not oxidized.

Then, there was carried out electroplating at 1.2 A for 24 minutes in sulfuric acid bath to thereby deposit the second metal film 134 on the first metal film 127 and the second to fourth electrically conductive thin layers 122 to 125, as illustrated in FIG. 11E. As a result, the second metal film 134 was deposited only on the second electrically conductive thin layer 123, as illustrated in FIG. 11E.

Thereafter, the first electrically conductive thin layer 122 was etched for removal in a region no covered with the second metal film 134, as illustrated in FIG. 11F.

[Fifth Embodiment]

FIGS. 12A to 12G are cross-sectional views of a patterned structure, each illustrating respective step of a method of fabricating the patterned structure, in accordance with the fifth embodiment of the present invention.

It should be noted that a lower pattern located below a via-hole is omitted in FIGS. 12A to 12G.

Figure 12A:
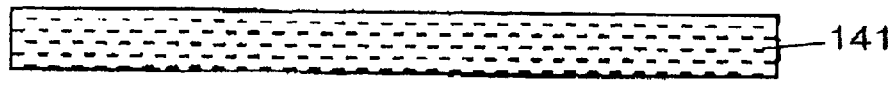
FIGS. 12A to 12G are cross-sectional views of a patterned structure, each illustrating respective step of a method of fabricating the patterned structure, in accordance with the fifth embodiment of the present invention.

First, as illustrated in FIG. 12A, there is prepared a substrate 141 composed of organic material, ceramic, alumina or silicon.

Figure 12B:
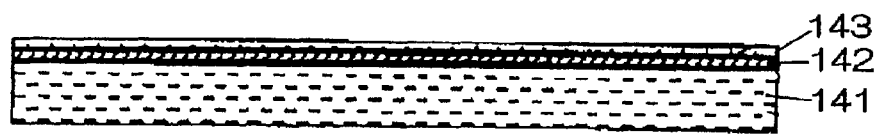

Then, as illustrated in FIG. 12B, a first electrically conductive thin layer 142 is formed on the substrate 141 by sputtering, evaporation or CVD. The first electrically conductive thin layer 142 is composed preferably of titanium or chromium in order to ensure adhesion with the substrate 141. As an alternative, the first electrically conductive thin layer 142 may be composed of a transition metal belonging to IVa group, Va group or VIa group, or an alloy thereof.

Then, as illustrated in FIG. 12B, a second electrically conductive thin layer 143 is formed all over the first electrically conductive thin layer 142 by sputtering, evaporation or CVD.

The second electrically conductive thin layer 143 is composed preferably of a metal having small electric resistance. For instance, the second electrically conductive thin layer 143 is composed preferably of copper or silver. As an alternative, the second electrically conductive thin layer 143 may be composed of aluminum or transition metals belonging to VIIIa group or Ib group, such as palladium, gold and platinum.

Prior to the formation of the first and second electrically conductive thin layers 142 and 143, a planarized insulating resin layer may be formed on the substrate 141.

Figure 12C:
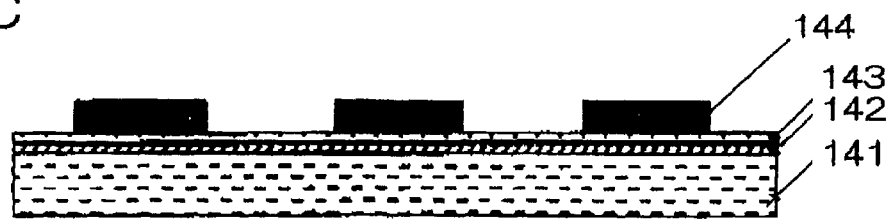

Then, resist 144 is deposited all over the second electrically conductive thin layer 143, and then, is patterned into a predetermined pattern, as illustrated in FIG. 12C.

Figure 12D:
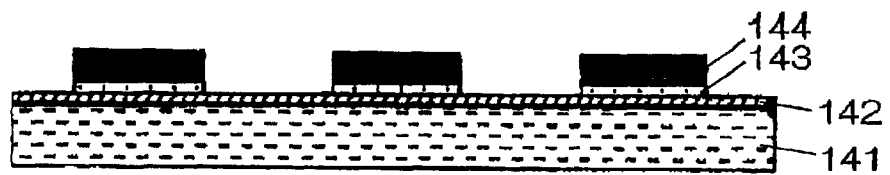

Then, the second electrically conductive layer 143 is etched with the resist 144 being used as a mask. Thus, the second electrically conductive layer 143 is removed in a region not covered with the resist 144, to thereby expose the first electrically conductive thin layer 142, as illustrated in FIG. 12D.

Figure 12E:
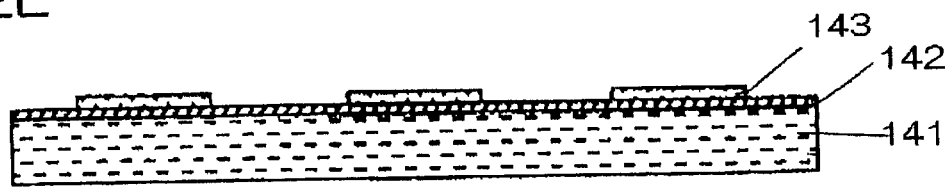

Then, the resist 144 is removed through the use of organic solvent, as illustrated in FIG. 12E.

Figure 12F:
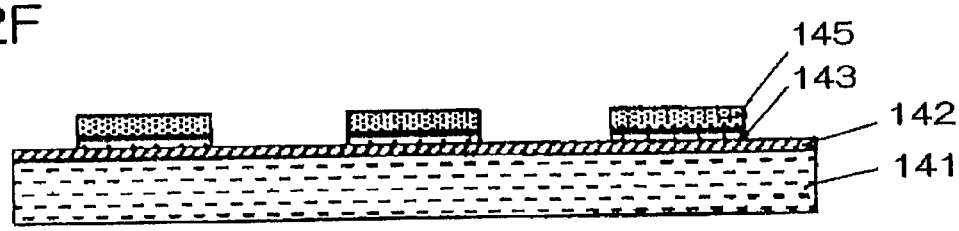

Then, there is carried out electroplating to thereby deposit a first metal film 145 only on the second electrically conductive thin layer 143, as illustrated in FIG. 12F. Since the second electrically conductive thin layer 143 has an electric resistance different from that of the first electrically conductive thin layer 142, and the second electrically conductive thin layer 143 is planarized, it is possible to control an area in which the first metal film 145 is to be deposited. Thus, the second metal film 145 can be deposited only on the second electrically conductive thin layer 143.

The first metal film 145 is composed preferably of copper in view of fabrication cost. As an alternative, the first metal film 145 may be composed of silver having a small electric resistane, or metals which can be electroplating, such as gold, iron, nickel, tin, platinum, palladium and zinc, and an alloy thereof.

Figure 12G:
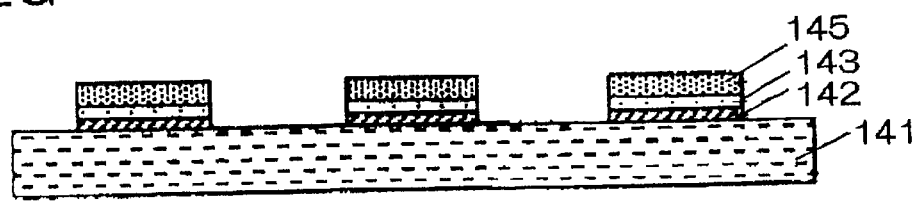

Then, the first electrically conductive thin layer 142 is etched for removal in a region not covered with the first metal film 145, as illustrated in FIG. 12G.

In accordance with the above-mentioned fifth embodiment, the second electrically conductive film 143 remains only in a first area where the first metal film 145 is to be deposited, and the first electrically conductive film 142 remains in a second area which is other than the first area. Hence, it is possible to control an area where the first metal film 145 is to be deposited, which would ensure that the first metal film 145 is deposited in accordance with a predetermined pattern.

Hereinbelow is explained a detailed example of the above-mentioned fifth embodiment.

In the example, there was used a glass-fiber reinforced organic substrate as the substrate 141 illustrated in FIG. 12A.

First, the first and second electrically conductive thin layers 142 and 143 were formed on the substrate 141 in this order, as illustrated in FIG. 12B. The first electrically conductive thin layer 142 was composed of titanium, and the second electrically conductive thin layer 143 was composed of copper.

In sputtering, a chamber in which the substrate 141 was laid was made vacuous to $1\times10^{-7}$ Torr, and then, to $4\times10^{-3}$ Torr by introducing argon into the chamber. Then, the first electrically conductive thin layer 142 was deposited at 5 A of a current applied thereto and at a trace speed of 300 mm/min, and the second electrically conductive thin layer 143 was deposited at 4 A of a current applied thereto and at a trace speed of 300 mm/min. The first electrically conductive thin layer 142 was 200 nm thick, and the second electrically conductive thin layer 143 was 220 nm thick.

Then, positive type photoresist commercially available from Tokyo Ohak Kogyo Co. Ltd. in the tradename "P-LA900PM" as the resist 144 was coated on the second electrically conductive thin layer 143 by a thickness of 10 $\mu$m by means of a spin-coater, and then, heated at 90 degrees centigrade for 30 minutes. Then, the resist 144 was exposed to light at 600 mJ/cm$^2$ through the use of a photomask, and developed by dipping the resist 144 into alkaline developing agent for 6 minutes. Thus, the resist 144 was patterned, as illustrated in FIG. 12C.

Then, the second electrically conductive layer 143 was etched with the resist 144 being used as a mask. Thus, the second electrically conductive layer 143 was removed in a region not covered with the resist 144, to thereby expose the first electrically conductive thin layer 142, as illustrated in FIG. 12D.

Then, the resist 144 was removed through the use of organic solvent, as illustrated in FIG. 12E.

Thereafter, the resist 144 was ashed at 45 degrees centigrade for 4 minutes in oxygen plasma to thereby completely remove the residual resist 144. While the resist 144 was ashed for removal, an exposed portion of the first electrically conductive thin layer 142 composed of titanium was also oxidized. By oxidizing an exposed portion of the first electrically conductive thin layer 142, the first electrically conductive thin layer 142 can have a higher electric resistance, and also have higher insolubility to acid. A portion of the first electrically conductive thin layer 142, covered with the second electrically conductive thin layer 143, was not oxidized.

Then, there was carried out copper electroplating to thereby deposit the first metal film 145 only on the second electrically conductive thin layer 143, as illustrated in FIG. 12F. The first metal film 145 was composed of copper. Since the second electrically conductive thin layer 143 has an electric resistance different from that of the first electrically conductive thin layer 142, and the second electrically conductive thin layer 143 is planarized, the second metal film 145 can be deposited only on the second electrically conductive thin layer 143.

Then, the first electrically conductive thin layer 142 was etched for removal in a region not covered with the first metal film 145, as illustrated in FIG. 12G.

[Sixth Embodiment]

The above-mentioned fifth embodiment is accompanied with a problem that the multi-layered structure including the first and second electrically conductive thin layers 142 and 143 and the first metal film 145 may be varied in shape when the first metal film 145 is deposited. The sixth embodiment mentioned hereinbelow can solve this problem.

In brief, the sixth embodiment is different from the fifth embodiment in that prior to the formation of the first and second electrically conductive thin layers 142 and 143, there is formed a patterned insulating resin layer for making it possible to form a wiring having a predetermined shape.

FIGS. 13A to 13I are cross-sectional views of a patterned structure, each illustrating respective step of a method of fabricating the patterned structure, in accordance with the sixth embodiment of the present invention.

It should be noted that a lower pattern located below a via-hole is omitted in FIGS. 13A to 13I.

Figure 13A:
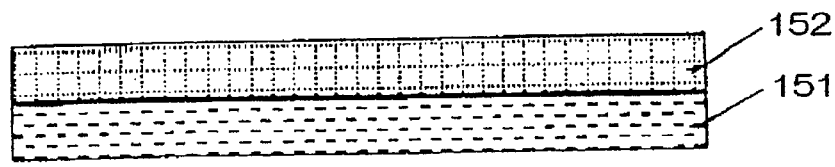
FIGS. 13A to 13I are cross-sectional views of a patterned structure, each illustrating respective step of a method of fabricating the patterned structure, in accordance with the sixth embodiment of the present invention.

First, as illustrated in FIG. 13A, an insulating resin layer 152 is formed on a substrate 151 composed of a material such as organic material, ceramic, alumina and silicon. If the insulating resin layer 152 is composed of liquid material, the liquid material is spread on the substrate 152 by spin-coating, diecoating, curtain-coating or printing. If the insulating resin layer 152 is composed of a dry film, a plurality of dry films is deposited on the substrate 151. Then, the insulating resin layer 152 is heated to thereby be cured.

Figure 13B:
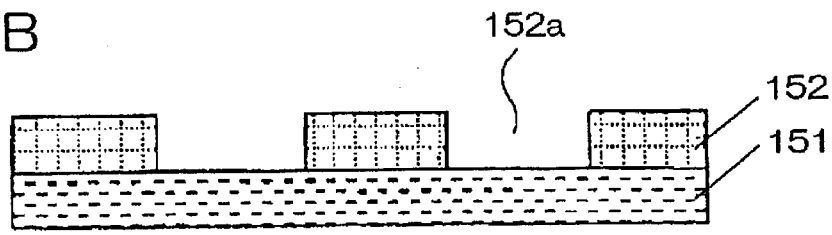

Then, if the insulating resin layer 152 is composed of photosensitive resin, the insulating resin layer 152 is patterned by photolithography and etching. If the insulating resin layer 152 is composed of non-photosensitive resin, the insulating resin layer 152 is patterned through the use of laser. Thus, there is formed a via-hole or recess 152a throughout the insulating resin layer 152, as illustrated in FIG. 13B.

A pitch between wirings and a diameter of the via-hole 152a are dependent on either a resolution of the insulating resin layer 152 if the insulating resin layer 152 is patterned by photolithography, or specific laser if the insulating resin layer 152 is patterned through the use of laser.

Figure 13C:
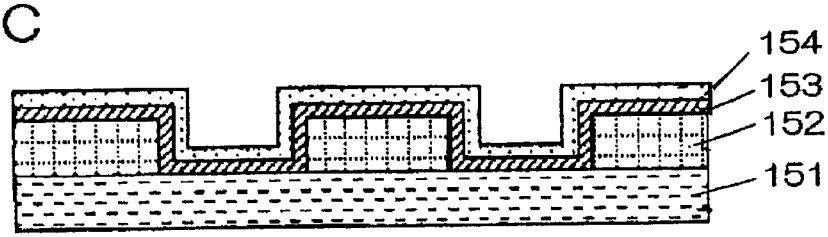

Then, as illustrated in FIG. 13C, a first electrically conductive thin layer 153 is formed over the patterned insulating resin layer 152 and the substrate 151 by sputtering, evaporation or CVD.

The first electrically conductive thin layer 153 is composed preferably of a metal having high adhesion with resin. For instance, the first electrically conductive thin layer 153 is composed most preferably of titanium or chromium. As an alternative, the first electrically conductive thin layer 153 may be composed of transition metals belonging to IVa group, Va group or VIa group, such as niobium, tantalum and tungsten.

Then, as illustrated in FIG. 13C, a second electrically conductive thin layer 154 is formed over the first electrically conductive thin layer 153 by sputtering, evaporation or CVD.

The second electrically conductive thin layer 154 is composed preferably of a metal having small electric resistance. For instance, the second electrically conductive thin layer 154 is composed preferably of copper or silver. As an alternative, the second electrically conductive thin layer 154 may be composed of aluminum or transition metals belonging to VIIIa group or Ib group, such as palladium, gold and platinum.

Figure 13D:
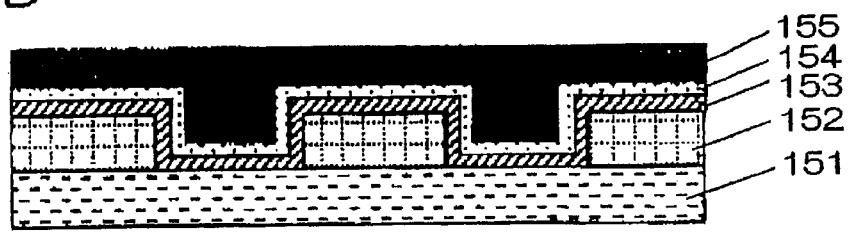

Then, as illustrated in FIG. 13D, resist 155 is deposited over the second electrically conductive thin layer 154. If the resist 155 is composed of liquid material, the liquid material is deposited on the second electrically conductive thin layer 154 by spin-coating, die-coating, curtain-coating or printing. If the resist 155 is composed of a dry film, a plurality of dry films is deposited on the second electrically conductive thin layer 154. Then, the resist 155 is heated to thereby be cured.

Figure 13E:
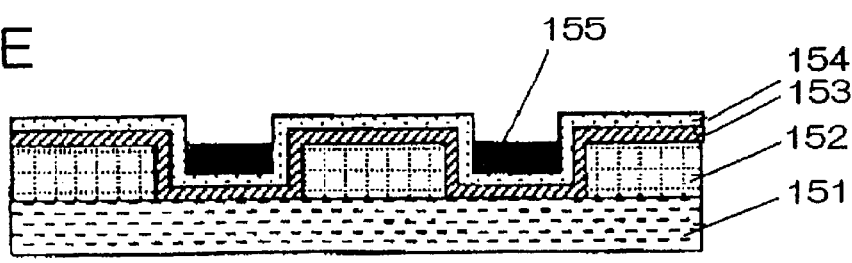

Then, the resist 155 is etched in such a manner that the resist 155 remains only in the via-hole 152a, as illustrated in FIG. 13E. If the resist 155 is composed of positive type photosensitive resin, the resist 155 is exposed to light and developed in accordance with the photolithography process so that the resist 155 remains only in the via-hole 152a. In the step of exposing the resist 155 to light in the photolithography process, it is not necessary to use a photomask such as a chromium mask for forming a pattern including a via-hole having a small area. In contrast, it would be necessary to use a photomask for forming a pattern including a via-hole having a large area, in order to make the resist 155 residual in the via-hole 152a.

Figure 13F:
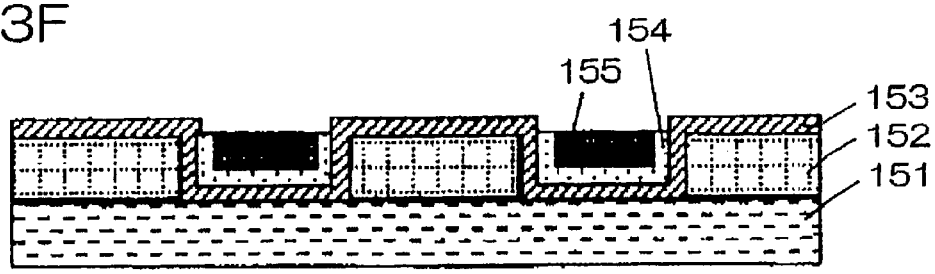

Then, as illustrated in FIG. 13F, the second electrically conductive thin layer 154 is etched through the use of acid in a region other than the via-hole 152a.

Figure 13G:
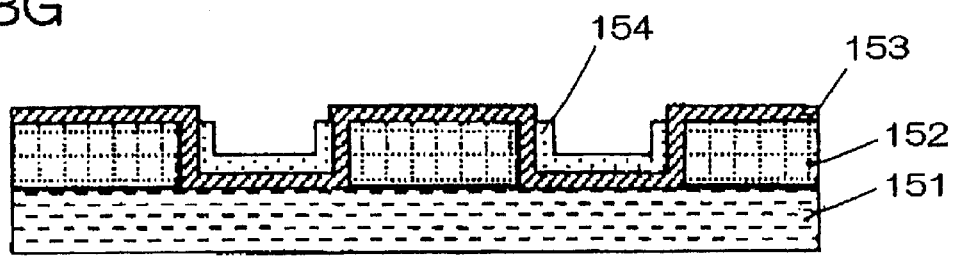

Then, as illustrated in FIG. 13G, the resist 155 remaining in the via-hole 152a is removed through the use of organic solvent. Since the second electrically conductive thin layer 154 remaining in the via-hole 152a has a resistance at a surface thereof which resistance is different from a resistance of the first electrically conductive thin layer 153 at a surface thereof, that is, electric resistances inside and outside the via-hole 152a are different from each other, it is possible to control an area where a later mentioned first metal film 156 is to be deposited.

Figure 13H:
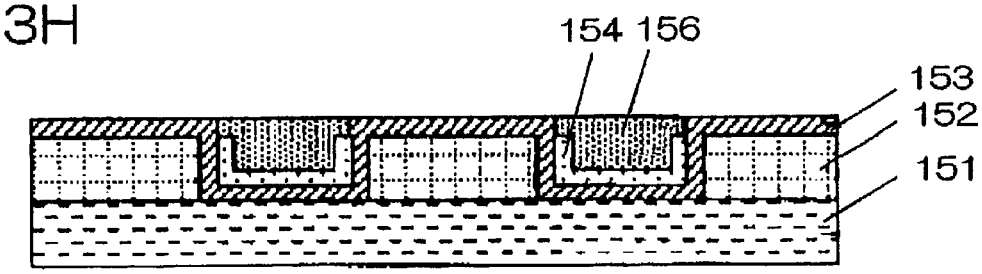

Then, there is carried out copper electroplating to thereby deposit a first metal film 156 only in the via-hole 152a, as illustrated in FIG. 13H. As mentioned above, since the exposed first electrically conductive thin layer 153 has a higher resistance than that of the second electrically conductive layer 154 located in the via-hole 152a, and is planarized, the first metal film 156 is quite difficult to be deposited on the first electrically conductive layer 153. Accordingly, the first metal film 156 can be deposited only in the via-hole 152a in which the second electrically conductive layer 154 remains.

The first metal film 156 is composed preferably of copper in view of fabrication cost. As an alternative, the first metal film 28 may be composed of silver having a small electric resistance, or metals which can be electroplating, such as gold, iron, nickel, tin, platinum, palladium and zinc, and an alloy thereof.

Figure 13I:
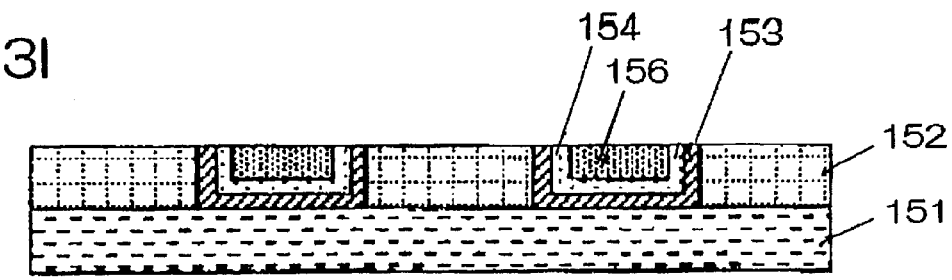

Then, the first electrically conductive layer 153 and the first metal film 156 are polished by buff-polishing. Thus, as illustrated in FIG. 13I, a resultant structure is planarized at a surface thereof. If the first and second electrically conductive layer 153 can be etched, it may be removed by etching. After planarization, a product is washed, and thus, there is completed the patterned structure through the method in accordance with the sixth embodiment.

In accordance with the above-mentioned sixth embodiment, the insulating resin layer 152 is patterned so as to have the via-hole 152a prior to the formation of the first and second electrically conductive thin layers 153 and 154. Hence, it is possible to form a wiring layer in a desired shape, and to solve the problem that the wiring pattern may be deflected when the first metal film 156 is deposited.

Hereinbelow is explained a detailed example of the above-mentioned sixth embodiment.

In the example, there was used a glass-fiber reinforced organic substrate as the substrate 151, and the insulating resin layer 152 was composed of a material commercially available from Shin-nittetsu Kagaku Co. Ltd. in the tradename of "V-259PA" including epoxy acrylate resin having negative type fluorene skeleton, as main ingredient.

First, the above-mentioned negative type epoxy acrylate resin was coated on the substrate 151 by a thickness of 10 $\mu$m by means of a spin-coater, and then, heated at 75 degrees centigrade for 40 minutes, as illustrated in FIG. 13A. Thereafter, the resin was exposed to light at 200 mJ/cm$^2$, and developed by dipping the epoxy acrylate resin into 1%-sodium carbonate aqueous solution for 4 minutes, to thereby form the via-hole 152a therein. Then, epoxy acrylate resin residual in the via-hole 152a was ashed for removal at 45 degrees centigrade for 2 minutes in oxygen plasma.

Then, the epoxy acrylate resin was heated at 200 degrees centigrade for 30 minutes in nitrogen gas atmosphere to thereby be cured. Thus, there was formed the insulating resin layer 152 patterned in such a shape as illustrated in FIG. 13B.

Then, as illustrated in FIG. 13C, the first electrically conductive thin layer 153 and the second electrically conductive thin layer 154 were formed over the insulating resin layer 152 by sputtering. The first electrically conductive thin layer 153 was composed of titanium, and the second electrically conductive thin layer 154 was composed of copper.

In sputtering of the first and second electrically conductive thin layers 153 and 154, a chamber in which the substrate 151 was laid was made vacuous to 1×10$^{-7}$ Torr, and then, to 4×10$^{-3}$ Torr by introducing argon into the chamber. Then, the first electrically conductive thin layer 153 was deposited at 5 A of a current applied thereto and at a trace speed of 300 mm/min, and the second electrically conductive thin layer 154 was deposited at 4 A of a current applied thereto and at a trace speed of 300 mm/min. The first electrically conductive thin layer 153 was 200 nm thick, and the second electrically conductive thin layer 154 was 220 nm thick.

Then, as illustrated in FIG. 13D, the resist 155 was deposited all over the second electrically conductive thin layer 154. As the resist 155, there was used positive type photoresist commercially available from Tokyo Ohak Kogyo Co. Ltd. in the tradename "P-LA900PM". The resist 155 was coated on the second electrically conductive layer 154 by a thickness of 10 $\mu$m by means of a spin-coater, and then, heated at 90 degrees centigrade for 30 minutes. Then, the resist 155 was exposed to light at 240 mJ/cm$^2$ without using a photomask, and developed by dipping the resist 155 into alkaline developing agent for 6 minutes. Thus, as illustrated in FIG. 13E, the resist 155 remained only in the via-hole 152a.

Then, as illustrated in FIG. 13F, the second electrically conductive thin layer 154 was etched through the use of acid in a region other than the via-hole 152a.

Then, as illustrated in FIG. 13G, the resist 155 remaining in the via-hole 152a was roughly removed through the use of organic solvent. Thereafter, the resist 155 remaining in the via-hole 152a was ashed at 45 degrees centigrade for 4 minutes in oxygen plasma to thereby completely remove the resist 155.

While the resist 155 was ashed for removal, an exposed portion of the first electrically conductive thin layer 153 composed of titanium was also oxidized. By oxidizing an exposed portion of the first electrically conductive thin layer 153, the first electrically conductive thin layer 153 can have a higher electric resistance, and also have higher insolubility to acid. A portion of the first electrically conductive thin layer 153, covered with the second electrically conductive thin layer 154 in the via-hole 152a, was not oxidized.

Then, there was carried out copper electroplating to the substrate in sulfuric acid bath at 1.2 A for 24 minutes to thereby deposit the first metal film 156 only in the via-hole 152a, as illustrated in FIG. 13H. The first metal film 156 was composed of copper.

Then, the product illustrated in FIG. 13H was polished with a buff No. 1000 to thereby planarize the upper electrode, as illustrated in FIG. 13I. Though copper was deposited in the form of particles on the first electrically conductive thin layer 153 composed of oxidized titanium during copper plating, it was confirmed by the experiments that the copper deposited on the first electrically conductive thin layer 153 could be completely removed in the buff-polishing step and/or the step of etching the first electrically conductive thin layer 153.

When photolithography is carried out to fill a via-hole with a metal film, it is generally necessary to remove a resist in a predetermined region where a via-hole is to be formed, and to deposit metal in the region. However, in accordance with the above-mentioned example, it is possible to fill the via-hole 152a with the resist 155 without using a photomask. Thus, though dependent on a pattern size, it is possible to fill a via-hole with metal without using a mask, only by removing a resist in a predetermined region.

Accordingly, it would be possible to pattern a resist into a desired pattern without taking into consideration misregistration between a via-hole and a mask, caused by a bent of a substrate, for instance, and to prevent metal from being plated on an unnecessary portion.

[Seventh Embodiment]

The seventh embodiment relates to a multi-layered wiring structure based on the patterned structure fabricated through the method in accordance with the above-mentioned sixth embodiment. FIGS. 14A to 14D are cross-sectional views of the multi-layered wiring structure, each illustrating respective step of a method of fabricating a multi-layered wiring, in accordance with the seventh embodiment of the present invention.

Figure 14A:
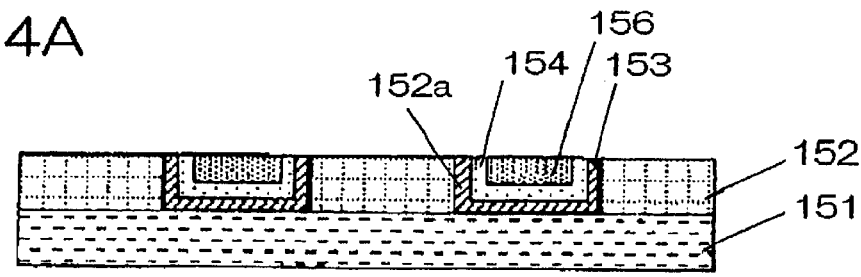
FIGS. 14A to 14D are cross-sectional views of a patterned structure, each illustrating respective step of a method of fabricating the patterned structure, in accordance with the seventh embodiment of the present invention.

First, as illustrated in FIG. 14A, there is formed a lower wiring layer through the method in accordance with the above-mentioned sixth embodiment. The lower wiring layer is comprised of the first electrically conductive thin layer 153 formed in the recess 152a formed in the insulating resin layer 152, the second electrically conductive thin layer 154 formed on the first electrically conductive thin layer 153, and the first metal film 156 surrounded by the second electrically conductive thin layer 154 in the via-hole 152a.

Figure 14B:
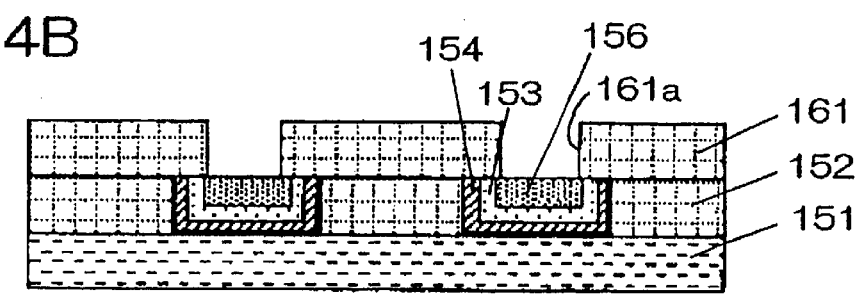

Then, a second insulating resin layer 161 is formed all over the product illustrated in FIG. 14A. Then, the second insulating resin layer 161 is patterned so as to have a via-hole 161a reaching the first metal film 156, as illustrated in FIG. 14B.

Figure 14C:
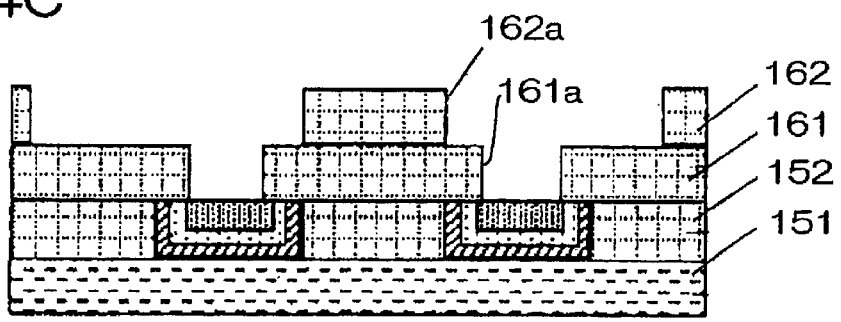

Then, a patterned third insulating resin layer 162 is formed on the second insulating resin layer 161, as illustrated in FIG. 14C. The patterned third insulating resin layer 162 is formed with a via-hole 162a having a width greater than and entirely covering a width of the via-hole 161a.

Figure 14D:
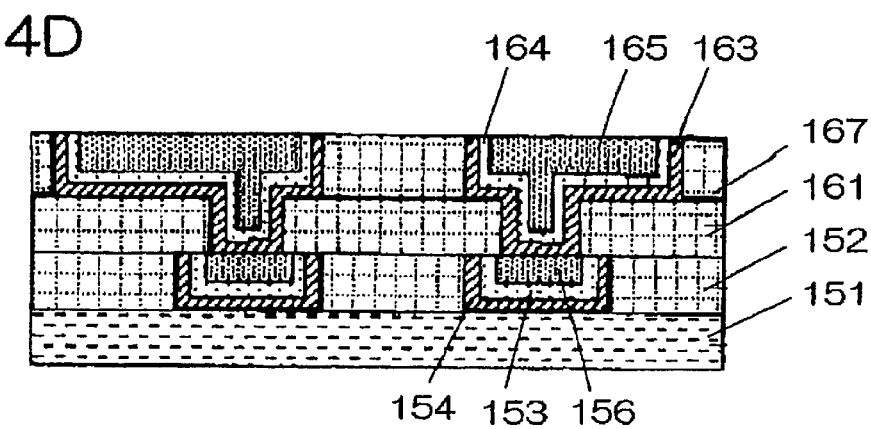

Then, as illustrated in FIG. 14D, an upper wiring layer is formed so as to fill the via-holes 161a and 162a therewith in the same way as the lower wiring layer. As illustrated in FIG. 14D, the upper wiring layer is comprised of a first electrically conductive thin layer 163 formed on inner walls of the via-holes 161a and 162a, a second electrically conductive thin layer 164 formed on the first electrically conductive thin layer 163, and a first metal film 165 surrounded by the second electrically conductive thin layer 164 in the via-holes 161a and 162a.

In accordance with the seventh embodiment, the lower and upper wiring layers can be planarized, and hence, it is possible to avoid an upper wiring layer from being deflected due to raised and/or recessed portions of a lower wiring layer.

In a conventional multi-layered wiring structure, it was necessary to deposit an insulating resin layer to be thick in order to planarize the multi-layered wiring structure. However, in accordance with the seventh embodiment, an insulating resin layer may be formed as thin as possible, which makes it possible to decrease a diameter of a via-hole.

In addition, since the via-holes 161a and 162a are filled with the first metal film, reliability in electrical connection can be enhanced, and another via-hole can be formed above the previously formed via-hole. Thus, the method in accordance with the seventh embodiment has an advantage that the number of fabrication steps can be reduced in comparison with a semi-additive method which is a conventional method.

[Eighth Embodiment]

The above-mentioned sixth and seventh embodiments may be accompanied with a problem that if the electrically conductive thin layers had a high resistance, a plating voltage would not be uniformized, and hence, the first metal film could not be uniformly deposited. The eighth embodiment explained hereinbelow can solve this problem.

In brief, the eighth embodiment is different from the sixth and seventh embodiments in a multi-layered structure formed on an insulating resin layer.

FIGS. 15A to 15I are cross-sectional views of a patterned structure, each illustrating respective step of a method of fabricating the patterned structure, in accordance with the eighth embodiment of the present invention.

It should be noted that a lower pattern located below a via-hole is omitted in FIGS. 15A to 15I.

Figure 15A:
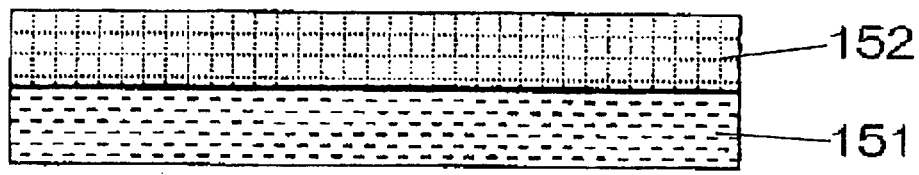
FIGS. 15A to 15I are cross-sectional views of a patterned structure, each illustrating respective step of a method of fabricating the patterned structure, in accordance with the eighth embodiment of the present invention.
Figure 15B:
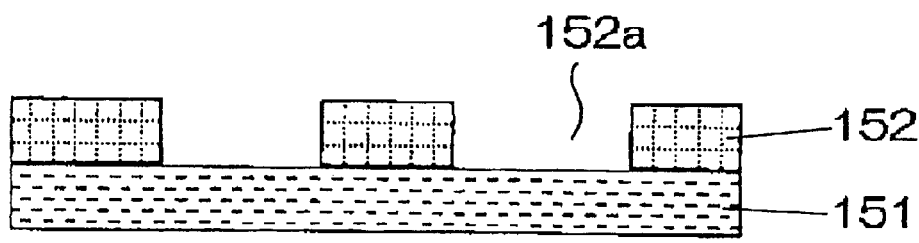

As mentioned earlier, the eighth embodiment is different from the seventh embodiment only in electrically conductive thin layers to be formed on an insulating resin layer. Hence, the steps as shown in FIGS. 15A, 15B and 15D which are other than the step of forming electrically conductive thin layers are not omitted.

Figure 15C:
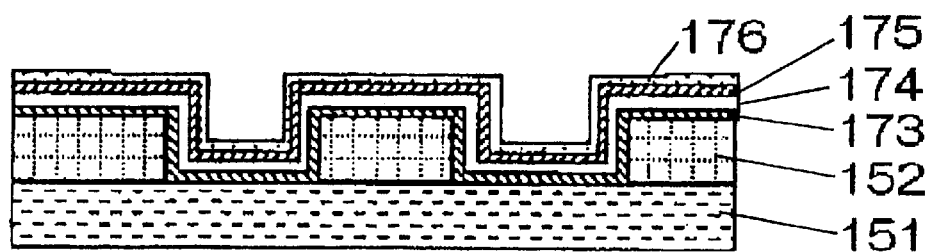
Figure 15D:
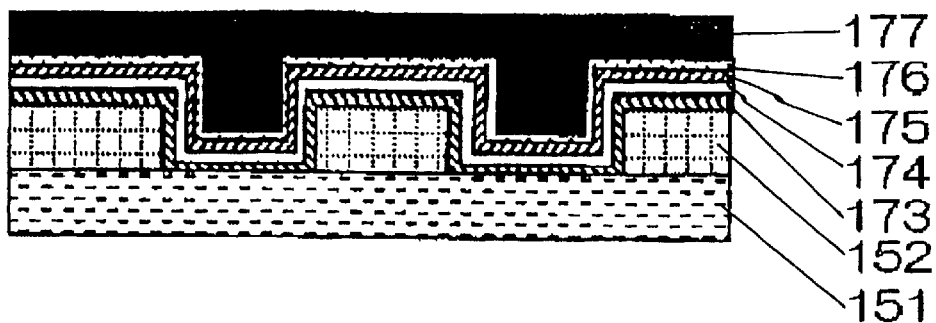

As illustrated in FIG. 15C, first, second, third and fourth electrically conductive thin layers 173, 174, 175 and 176 are formed over the patterned insulating resin layer 152 and the substrate 151 in this order by sputtering, evaporation or CVD.

The first electrically conductive thin layer 173 is required to provide adhesion with an underlying layer. Hence, the first electrically conductive thin layer 173 is composed preferably of transition metals belonging to IVa group, Va group, VIa group, such as titanium, niobium, tantalum, tungsten and chromium, and an alloy thereof.

The second electrically conductive thin layer 174 is composed preferably of a metal which is capable of uniformizing a voltage during plating. For instance, the second electrically conductive thin layer 174 is composed preferably of copper or silver, because they have a small electric resistance. As an alternative, the second electrically conductive thin layer 174 may be aluminum or transition metals belonging to VIIIa group or Ib group, such as palladium, gold and platinum.

The third electrically conductive thin layer 175 is composed preferably of a metal having high resistance to acid in view of subsequent steps. For instance, the third electrically conductive thin layer 175 is composed preferably of transition metals belonging to IVa group, Va group or VIa group, such as titanium, niobium, tantalum, tungsten and chromium.

The fourth electrically conductive thin layer 176 is composed preferably of a metal having small electric resistance. For instance, the fourth electrically conductive thin layer 176 is composed preferably of copper or silver. As an alternative, the fourth electrically conductive thin layer 176 may be composed of aluminum or transition metals belonging to VIIIa group or Ib group, such as palladium, gold and platinum.

In accordance with the above-mentioned eighth embodiment, since the first to fourth electrically conductive thin layers 173 to 176 are deposited in this order, a total resistance can be reduced in comparison with a resistance of a single electrically conductive layer having the same thickness as a total thickness of the first to fourth electrically conductive thin layers 173 to 176. As a result, it is possible to prevent a plating voltage from becoming non-uniform during plating, and hence, ensure uniform deposition of the first metal film 156.

Hereinbelow is explained a detailed example of the above-mentioned eighth embodiment.

In the example, there was used a glass-fiber reinforced organic substrate as the substrate 151, and the insulating resin layer 152 was composed of a material commercially available from Shin-nittetsu Kagaku Co. Ltd. in the tradename of "V-259PA" including epoxy acrylate resin having negative type fluorene skeleton, as main ingredient.

First, as illustrated in FIG. 15A, the above-mentioned negative type epoxy acrylate resin 152 was coated on the substrate 151 by a thickness of 10 $\mu$m by means of a spin-coater, and then, heated at 75 degrees centigrade for 40 minutes. Then, the epoxy acrylate resin was exposed to light at 200 mJ/cm$^2$, and developed by dipping into 1%-sodium carbonate aqueous solution for 4 minutes, to thereby form a via-hole 152a therein. Then, epoxy acrylate resin residual in the via-hole 152a was ashed for complete removal at 45 degrees centigrade for 2 minutes in oxygen plasma.

Then, the epoxy acrylate resin was heated at 200 degrees centigrade for 30 minutes in nitrogen gas atmosphere to thereby be cured. Thus, there was formed the insulating resin layer 152 patterned so as to have the via-hole 52a, as illustrated in FIG. 15B.

Then, as illustrated in FIG. 15C, the first electrically conductive thin layer 173, the second electrically conductive thin layer 174, the third electrically conductive thin layer 175 and the fourth electrically conductive thin layer 176 were formed over the patterned insulating resin layer 23 and the substrate 151 by sputtering. The first and third electrically conductive thin layers 173 and 175 were composed of titanium, and the second and fourth electrically conductive thin layers 174 and 176 were composed of copper.

In sputtering of the first to fourth electrically conductive thin layers 173 to 176, a chamber in which the substrate 151 was laid was made vacuous to $1 \times 10^{-7}$ Torr, and then, to $4 \times 10^{-3}$ Torr by introducing argon into the chamber. Then, the first and third electrically conductive thin layers 173 and 175 were deposited at 5 A of a current applied thereto and at a trace speed of 300 mm/min, and the second and fourth electrically conductive thin layers 174 and 176 were deposited at 4 A of a current applied thereto and at a trace speed of 300 mm/min. The first and third electrically conductive thin layers 173 and 175 were 200 nm thick, and the second and fourth electrically conductive thin layers 174 and 176 were 220 nm thick.

Figure 15E:
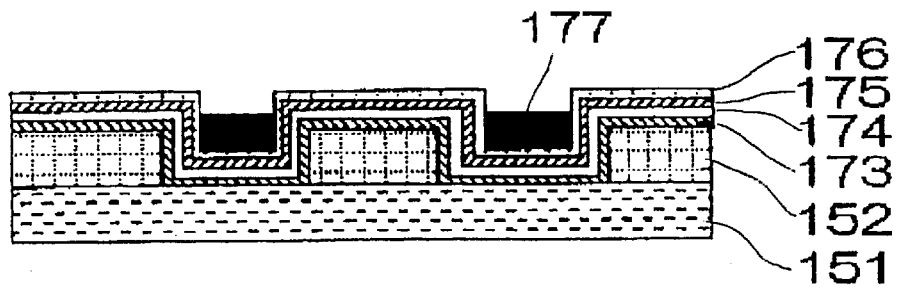

Then, as illustrated in FIG. 15D, resist 177 was deposited all over the fourth electrically conductive thin layer 176. As the resist 177, there was used positive type photoresist commercially available from Tokyo Ohak Kogyo Co. Ltd. in the tradename "P-LA900PM". The resist 177 was coated on the fourth electrically conductive layer 176 by a thickness of 10 μm by means of a spin-coater, and then, heated at 90 degrees centigrade for 30 minutes. Then, the resist 177 was exposed to light at 240 mJ/cm$^2$ without using a photomask, and developed by dipping the resist 177 into alkaline developing agent for 6 minutes. Thus, as illustrated in FIG. 15E, the resist 177 remained only in the via-hole 152a.

Figure 15F:
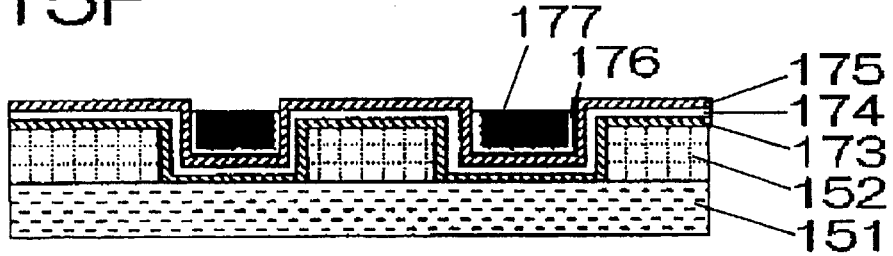

Then, as illustrated in FIG. 15F, the fourth electrically conductive thin layer 176 was etched through the use of acid in a region other than the via-hole 152a.

Figure 15G:
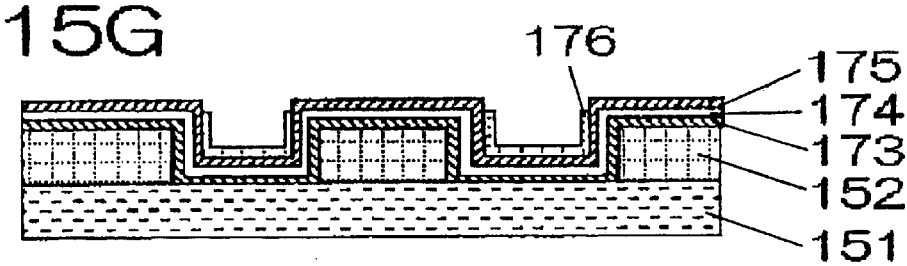

Then, as illustrated in FIG. 15G, the resist 177 remaining in the via-hole 152a was roughly removed through the use of organic solvent. Thereafter, the resist 177 remaining in the via-hole 152a was ashed at 45 degrees centigrade for 4 minutes in oxygen plasma to thereby completely remove the resist 177.

While the resist 177 was ashed for removal, an exposed portion of the third electrically conductive thin layer 175 composed of titanium was also oxidized. By oxidizing an exposed portion of the third electrically conductive thin layer 175, the third electrically conductive thin layer 175 can have a higher electric resistance, and also have higher insolubility to acid. A portion of the third electrically conductive thin layer 175, covered with the fourth electrically conductive thin layer 176 in the via-hole 152a, was not oxidized, and the second electrically conductive thin layer 174 was not caused to have a higher resistance.

Figure 15H:
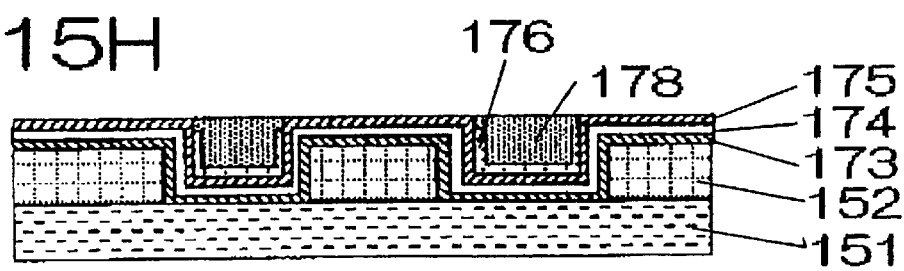

Then, there was carried out copper electroplating to the substrate in sulfuric acid bath at 0.6 A for 24 minutes to thereby deposit a first metal film 178 only in the via-hole 152a, as illustrated in FIG. 15H. The first metal film 178 was composed of copper.

Figure 15I:
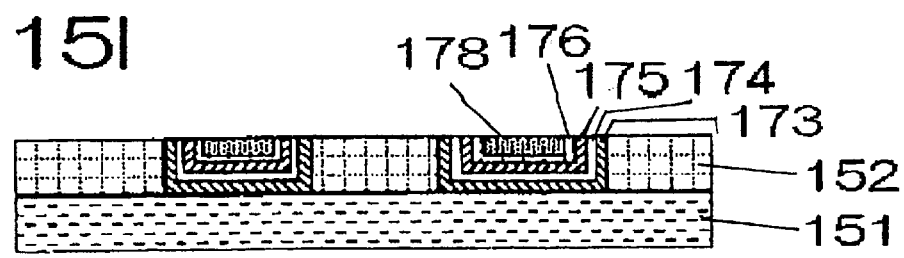

Then, the product illustrated in FIG. 15H was polished with a buff No. 1000 to thereby planarize the first electrically conductive thin layer 173, the second electrically conductive thin layer 174, the third electrically conductive thin layer 175 and the first metal film 178, as illustrated in FIG. 15I.

Though copper was deposited in the form of particles on the third electrically conductive thin layer 175 composed of oxidized titanium during copper plating, it was confirmed by the experiments that the copper deposited on the third electrically conductive thin layer 175 could be completely removed in the buff-polishing step.

In addition, the above-mentioned patterned structure can be formed on a substrate having a larger area, by uniformizing a voltage at which the copper electroplating is carried out for depositing the first metal film 178.

Since the thus fabricated patterned structure has a planarized upper surface, it would be possible to fabricate a multi-layered wiring structure by repeating the steps of the method in accordance with the eighth embodiment.

When photolithography is carried out to fill a via-hole with a metal film, it is generally necessary to remove a resist in a predetermined region where a via-hole is to be formed, and to deposit metal in the region. However, in accordance with the above-mentioned example, it is possible to fill the via-hole 152a with the resist 177 without using a photomask. Thus, though dependent on a pattern size, it is possible to fill a via-hole with metal without using a mask, only by removing a resist in a predetermined region.

Accordingly, it would be possible to pattern a resist into a desired pattern without taking into consideration misregistration between a via-hole and a mask, caused by a bent of a substrate, for instance, and to prevent metal from being plated on an unnecessary portion.

[Ninth Embodiment]

The ninth embodiment has some steps common to those of the fifth or sixth embodiment, but has different steps from the fifth or sixth embodiment with respect to both electrically conductive thin layers to be formed over an insulating resin layer and steps to be carried out subsequently to the formation of the electrically conductive thin layers.

FIGS. 16A to 16H are cross-sectional views of a patterned structure, each illustrating respective step of a method of fabricating the patterned structure, in accordance with the ninth embodiment of the present invention.

It should be noted that a lower pattern located below a via-hole is omitted in FIGS. 16A to 16H.

Figure 16A:
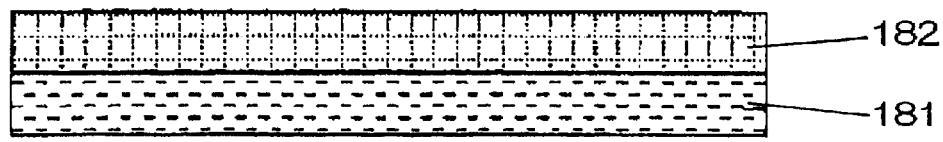
FIGS. 16A to 16H are cross-sectional views of a patterned structure, each illustrating respective step of a method of fabricating the patterned structure, in accordance with the ninth embodiment of the present invention.

First, as illustrated in FIG. 16A, an insulating resin layer 182 is formed on a substrate 181 composed of a material such as organic material, ceramic, alumina and silicon. If the insulating resin layer 182 is composed of liquid material, the liquid material is spread on the substrate 182 by spin-coating, die-coating, curtain-coating or printing. If the insulating resin layer 182 is composed of a dry film, a plurality of dry films is deposited on the substrate 181. Then, the insulating resin layer 182 is heated to thereby be cured.

Figure 16B:
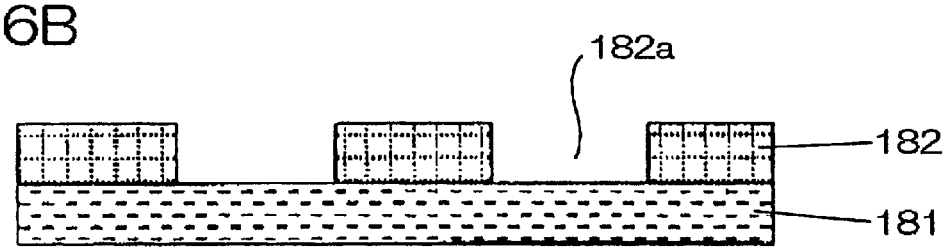

Then, if the insulating resin layer 182 is composed of photosensitive resin, the insulating resin layer 182 is patterned by photolithography and etching. If the insulating resin layer 182 is composed of non-photosensitive resin, the insulating resin layer 182 is patterned through the use of laser. Thus, there is formed a via-hole or recess 182a throughout the insulating resin layer 182, as illustrated in FIG. 16B.

A pitch between wirings and a diameter of the via-hole 182a are dependent on either a resolution of the insulating resin layer 182 if the insulating resin layer 182 is patterned by photolithography, or specific laser if the insulating resin layer 182 is patterned through the use of laser.

Figure 16C:
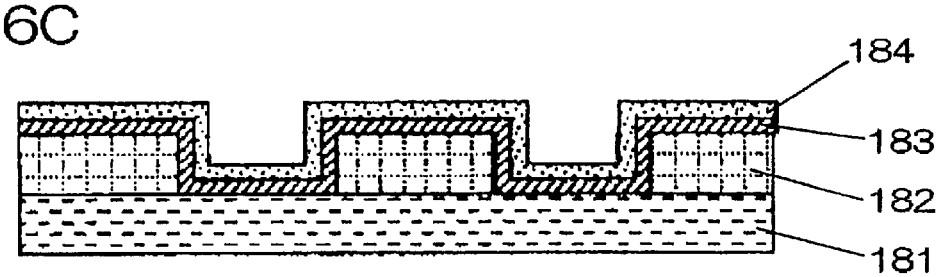

Then, as illustrated in FIG. 16C, a first electrically conductive thin layer 183 is formed over the patterned insulating resin layer 182 and the substrate 181 by sputtering, evaporation or CVD.

The first electrically conductive thin layer 183 is composed preferably of a metal having high adhesion with resin. For instance, the first electrically conductive thin layer 183 is composed preferably of transition metals belonging to IVa group, Va group or VIa group, such as chromium, titanium, molybdenum, niobium and tantalum.

Then, as illustrated in FIG. 16C, a second electrically conductive thin layer 154 is formed over the first electrically conductive thin layer 183 by sputtering, evaporation or CVD.

The second electrically conductive thin layer 184 is composed of catalyser metal which acts as a catalyser to metals with which electroless plating is carried out. For instance, the second electrically conductive thin layer 184 is composed preferably of palladium or zinc.

Figure 16D:
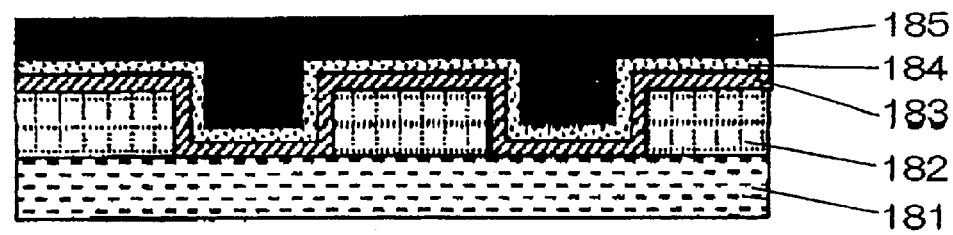

Then, as illustrated in FIG. 16D, resist 185 is deposited over the second electrically conductive thin layer 184. If the resist 185 is composed of liquid material, the liquid material is deposited on the second electrically conductive thin layer 184 by spin-coating, die-coating, curtain-coating or printing. If the resist 185 is composed of a dry film, a plurality of dry films is deposited on the second electrically conductive thin layer 184. Then, the resist 185 is heated to thereby be cured.

Figure 16E:
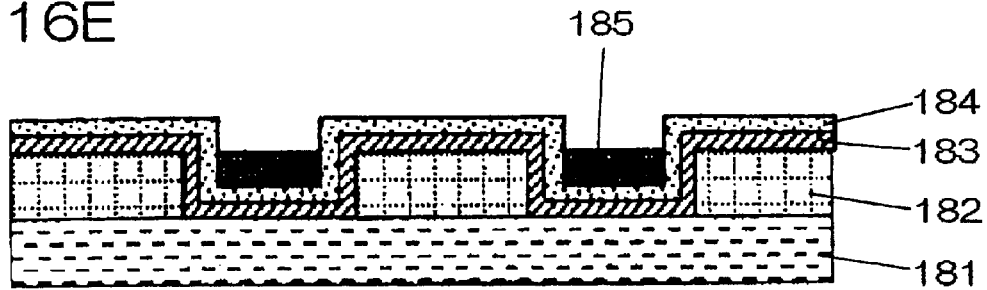

Then, the resist 185 is etched in such a manner that the resist 185 remains only in the via-hole 182a, as illustrated in FIG. 16E. If the resist 185 is composed of positive type photosensitive resin, the resist 185 is exposed to light and developed in accordance with the photolithography process so that the resist 185 remains only in the via-hole 182a. In the step of exposing the resist 185 to light in the photolithography process, it is not necessary to use a photomask such as a chromium mask for forming a pattern including a via-hole having a small area. In contrast, it would be necessary to use a photomask for forming a pattern including a via-hole having a large area, in order to make the resist 185 residual in the via-hole 182a.

Figure 16F:
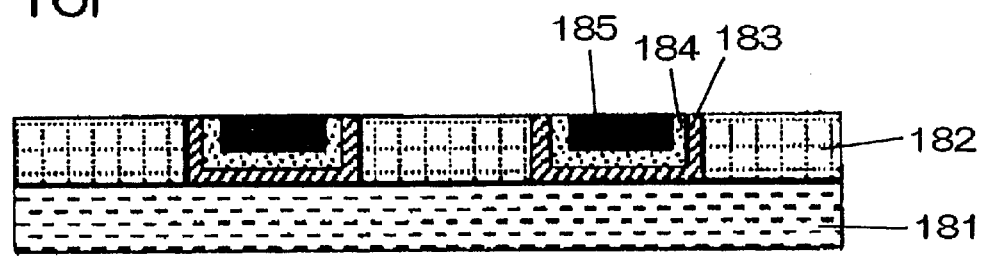

Then, as illustrated in FIG. 16F, the second and first electrically conductive thin layers 184 and 183 are polished through the use of a buff, for instance, to thereby planarize a surface of the structure. Since the via-hole 182a is covered with the resist 185, it is possible to prevent the second electrically conductive thin film 184 from being contaminated with shavings generated when the second and first electrically conductive thin layers 184 and 183 are polished.

If the second and first electrically conductive thin layers 184 and 183 can be etched, they may be etched for removal.

Figure 16G:
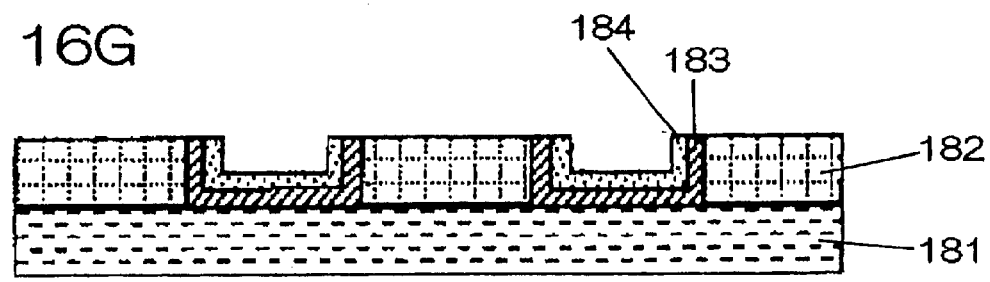

Then, as illustrated in FIG. 16G, the resist 185 remaining in the via-hole 182a is removed through the use of organic solvent.

Figure 16H:
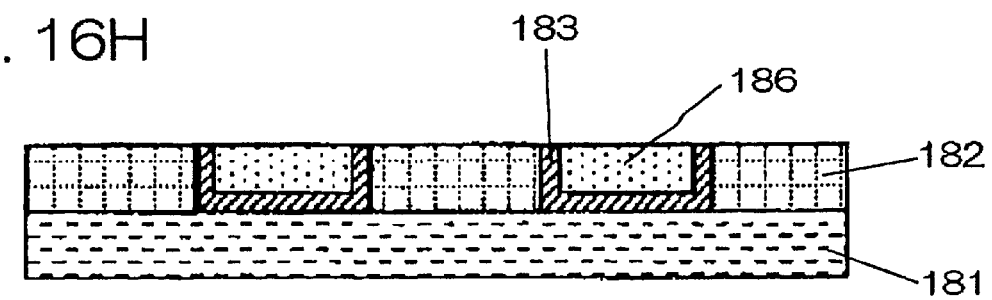

Then, the product as illustrated in FIG. 16G is dipped into electroless plating bath to thereby fill the via-hole 182 with a first metal film 186, as illustrated in FIG. 16H.

In accordance with the ninth embodiment, it is possible to form a wiring layer in a desired size by carrying out electroless plating.

In addition, a multi-layered wiring board can be fabricated by repeating the steps in the above-mentioned ninth embodiment.

In the ninth embodiment, since the second and first electrically conductive layers remain in the via-hole, there will never occur disconnection between upper and lower wiring layers due to non-deposition and reduction in adhesion with an underlying layer. In addition, since the second and first electrically conductive layers are removed in a region other than the via-hole, there will never occur migration of metal ions, which ensures reliability in electrical insulation. Thus, it would be possible to fabricate a multi-layered wiring board having resistance to migration.

Hereinbelow is explained a detailed example of the above-mentioned ninth embodiment.

In the example, there was used a glass-fiber reinforced organic substrate as the substrate 181, and the insulating resin layer 182 was composed of a material commercially available from Shin-nittetsu Kagaku Co. Ltd. in the tradename of "V-259PA" including epoxy acrylate resin having negative type fluorene skeleton, as main ingredient.

First, the above-mentioned negative type epoxy acrylate resin was coated on the substrate 181 by a thickness of 10 $\mu$m by means of a spin-coater, and then, heated at 75 degrees centigrade for 40 minutes, as illustrated in FIG. 16A. Thereafter, the resin was exposed to light at 200 mJ/cm$^2$, and developed by dipping the epoxy acrylate resin into 1%-sodium carbonate aqueous solution for 4 minutes, to thereby form the via-hole 182a therein. Then, epoxy acrylate resin residual in the via-hole 182a was ashed for removal at 45 degrees centigrade for 2 minutes in oxygen plasma.

Then, the epoxy acrylate resin was heated at 200 degrees centigrade for 30 minutes in nitrogen gas atmosphere to thereby be cured. Thus, there was formed the insulating resin layer 182 patterned in such a shape as illustrated in FIG. 16B.

Then, as illustrated in FIG. 16C, the first electrically conductive thin layer 183 and the second electrically conductive thin layer 184 were formed over the insulating resin layer 182 by sputtering. The first electrically conductive thin layer 183 was composed of titanium, and the second electrically conductive thin layer 184 was composed of copper.

In sputtering of the first and second electrically conductive thin layers 183 and 184, a chamber in which the substrate 181 was laid was made vacuous to $1\times10^{-7}$ Torr, and then, to $4\times10^{-3}$ Torr by introducing argon into the chamber. Then, the first electrically conductive thin layer 183 was deposited at 5 A of a current applied thereto and at a trace speed of 300 mm/min, and the second electrically conductive thin layer 184 was deposited at 4 A of a current applied thereto and at a trace speed of 300 mm/min. The first electrically conductive thin layer 183 was 150 nm thick, and the second electrically conductive thin layer 184 was 220 nm thick.

Then, as illustrated in FIG. 16D, the resist 185 was deposited all over the second electrically conductive thin layer 184. As the resist 185, there was used positive type photoresist commercially available from Tokyo Ohak Kogyo Co. Ltd. in the tradename "P-LA900PM". The resist 185 was coated on the second electrically conductive layer 184 by a thickness of 10 $\mu$m by means of a spin-coater, and then, heated at 90 degrees centigrade for 30 minutes. Then, the resist 185 was exposed to light at 240 mJ/cm$^2$ without using a photomask, and developed by dipping the resist 185 into alkaline developing agent for 6 minutes. Thus, as illustrated in FIG. 16E, the resist 185 remained only in the via-hole 182a.

Then, as illustrated in FIG. 16F, the second and first electrically conductive thin layers 184 and 183 were polished through the use of a buff, for instance, to thereby planarize a surface of the structure.

Then, as illustrated in FIG. 16G, the resist 185 remaining in the via-hole 182a was removed through the use of organic solvent.

Then, the product as illustrated in FIG. 16G was dipped into electroless plating copper bath having pH of 12.5, to thereby fill the via-hole 182 with a first metal film 186, as illustrated in FIG. 16H. Herein, the first metal film 186 is composed of copper.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 10-297040 filed on Oct. 19, 1998 and 11-25316 filed on Feb. 2, 1999, respectively, each including specification, claims, drawings and summary is incorporated herein by reference in its entirety.

What is claimed is:

1. A thin film capacitor comprising:
   (a) a lower electrode;
   (b) an insulating layer formed burying said lower electrode therein and formed with a via-hole reaching said lower electrode;
   (c) an organic resin dielectric layer formed on an inner sidewall of said vi-hole and covering an exposed surface of said lower electrode therewith; and
   (d) an upper electrode surrounded by said dielectric layer.

2. The thin film capacitor as set forth in claim 1, wherein said upper electrode is formed so that said via-hole is entirely filled with said upper electrode.

3. The thin film capacitor as set forth in claim 1, wherein upper surfaces of both said insulating layer and said upper electrode are planarized.

4. The thin film capacitor as set forth in claim 1, wherein said via-hole has a width smaller than a width of said lower electrode.

5. The thin film capacitor as set forth in claim 1, wherein said lower electrode is planar in shape.

6. The thin film capacitor as set forth in claim 1, wherein said upper electrode includes a three-layered structure including a first electrically conductive layer, a second electrically conductive layer formed on said first electrically conductive layer, and a third electrically conductive layer formed on said second electrically conductive layer, said first and third electrically conductive layers being composed of a metal or metals selected from the group consisting of copper, silver, aluminum, metals belonging to VIIIa group, and metals belonging to Ib group, said second electrically conductive layer being composed of a metal or metals selected from the group consisting of metals belonging to IVa group, metals belonging to Va group, metals belonging to VIa group, and alloys thereof.

7. The thin film capacitor as set forth in claim 1, wherein said upper electrode includes a four-layered structure including a first electrically conductive layer, a second electrically conductive layer formed on said first electrically conductive layer, a third electrically conductive layer formed on said second electrically conductive layer, and a fourth electrically conductive layer formed on said third electrically conductive layer, said first and third electrically conductive layers being composed of a metal or metals selected from the group consisting of metals belonging to IVa group, metals belonging to Va group, metals belonging to VIa group, and alloys thereof, said second and fourth electrically conductive layers being composed of a metal or metals selected from the group consisting of copper, silver, aluminum, metals belonging to VIIIa group, and metals belonging to Ib group.

8. The thin film capacitor as set forth in claim 1, wherein said dielectric layer is composed of a material selected from the group consisting of titanium oxide, tantalum oxide, $Al_2O_3$, $SiO_2$, $Nb_2O_5$, and perovskite family materials.

9. A thin film capacitor comprising:
(a) a lower electrode;
(b) a first insulating layer formed burying said lower electrode therein and formed with a via-hole reaching said lower electrode;
(c) an organic resin dielectric layer formed on an inner sidewall of said via-hole and covering an exposed surface of said lower electrode therewith;
(d) An upper electrode surrounded by said dielectric l layer;
(e) a second insulating layer formed over said first insulating layer, said dielectric layer, and said upper electrode, and formed with a via-hole reaching said upper electrode; and
(f) a wiring layer formed on said second insulating layer and making electrical connection with said upper electrode through said via-hole.

10. A thin film capacitor comprising:
(a) a lower electrode;
(b) an insulating layer formed burying said lower electrode therein and formed with a via-hole reaching said lower electrode;
(c) an organic resin dielectric layer formed on an inner sidewall of said via-hole and covering an exposed surface of said lower electrode therewith; and
(d) an upper electrode surrounded by said dielectric layer.

11. The substrate as set forth in claim 10, wherein said upper electrode is formed so that said via-hole is entirely filled with said upper electrode.

12. The substrate as set forth in claim 10, wherein upper surfaces of both said insulating layer and said upper electrode are planarized.

13. The substrate as set forth in claim 10, wherein said via-hole has a width smaller than a width of said lower electrode.

14. The substrate as set forth in claim 10, wherein said lower electrode is planar in shape.

15. The substrate as set forth in claim 10, wherein said upper electrode includes a three-layered structure including a first electrically conductive layer, a second electrically conductive layer formed on said first electrically conductive layer, and a third electrically conductive layer formed on said second electrically conductive layer, said first and third electrically conductive layers being composed of a metal or metals selected from the group consisting of copper, silver, aluminum, metals belonging to VIIIa group, and metals belonging to Ib group, said second electrically conductive layer being composed of a metal or metals selected from the group consisting of metals belonging to IVa group, metals belonging to Va group, metals belonging to VIa group, and alloys thereof.

16. The substrate as set forth in claim 10, wherein said upper electrode includes a four-layered structure including a first electrically conductive layer, a second electrically conductive layer formed on said first electrically conductive layer, a third electrically conductive layer formed on said second electrically conductive layer, and a fourth electrically conductive layer formed on said third electrically conductive layer, said first and third electrically conductive layers being composed of a metal or metals selected from the group consisting of metals belonging to IVa group, metals belonging to Va group, metals belonging to VIa group, and alloys thereof, said second and fourth electrically conductive layers being composed of a metal or metals selected from the group consisting of copper, silver, aluminum, metals belonging to VIIIa group, and metals belonging to Ib group.

17. The substrate as set forth in claim 10, wherein said dielectric layer is composed of a material selected from the group consisting of titanium oxide, tantalum oxide, $Al_2O_3$, $SiO_2$, $Nb_2O_5$, and perovskite family materials.

18. A substrate including a thin film capacitor therein,
(a) a lower electrode;
(b) a first insulating layer formed burying said lower electrode therein and formed with a via-hole reaching said lower electrode;
(c) an organic resin dielectric layer formed on an inner sidewall of said via-hole and covering an exposed surface of said lower electrode therewith;
(d) an upper electrode surrounded by said dielectric layer;
(e) a second insulating layer formed over said first insulating layer, said dielectric layer, and said upper electrode, and formed with a via-hole reaching said upper electrode; and
(f) a wiring layer formed on said second insulating layer and making electrical connection with said upper electrode through said via-hole.

19. A patterned structure comprising:
(a) an electrically conductive film having a four- or more-layered structure;
(b) an internal electrical conductor surrounded at a bottom and a sidewall thereof by said electrically conductive film; and
(c) an upper electrical conductor formed on both said electrically conductive film and said internal electrical conductor.

20. The patterned structure as set forth in claim 19, wherein said electrically conductive film has a four-layered structure including a first electrically conductive layer, a second electrically conductive layer formed on said first electrically conductive layer, a third electrically conductive layer formed on said second electrically conductive layer, and a fourth electrically conductive layer formed on said third electrically conductive layer,
said first and third electrically conductive layers being composed of a metal or metals selected from the group consisting of metals belonging to IVa group, metals belonging to Va group, metals belonging to VIa group, and alloys thereof, said second and fourth electrically conductive layers being composed of a metal or metals selected from the group consisting of copper, silver, aluminum, metals belonging to VIIIa group, and metals belonging to Ib group.

21. The patterned structure as set forth in claim 19, wherein said electrically conductive film has a four-layered structure including a first electrically conductive layer, a second electrically conductive layer formed on said first electrically conductive layer, a third electrically conductive layer formed on said second electrically conductive layer, and a fourth electrically conductive layer formed on said third electrically conductive layer,
said second electrically conductive layer having a greater thickness than a thickness of said fourth electrically conductive layer.

22. A thin film capacitor comprising:
a lower electrode;
an insulating layer formed burying said lower electrode therein and formed with a via-hole reaching said lower electrode;
a dielectric layer formed on an inner sidewall of said via-hole and covering an exposed surface of said lower electrode therewith; and
an upper electrode surrounded by said dielectric layer, the upper electrode comprising first, second, and third layers with the second layer being disposed between the first and third layers, wherein the second layer comprises a material different from a material comprising either of the first and third layers;
wherein the second electrically conductive layer is composed of a metal or metals selected from the group consisting of metals belonging to group IVa, metals belonging to group Va, metals belonging to group VIa, and alloys thereof.

23. The thin film capacitor of claim 22, wherein each of the first, second, and third layers is electrically conductive, the first and third conductive layers being composed of a metal or metals selected from the group consisting of copper, silver, aluminum, metals belonging to group VIIIa, and metals belonging to group Ib.

24. A thin film capacitor comprising:
a lower electrode;
an insulating layer formed burying said lower electrode therein and formed with a via-hole reaching said lower electrode;
a dielectric layer formed on an inner sidewall of said via-hole and covering an exposed surface of said lower electrode therewith; and
an upper electrode surrounded by said dielectric layer, the upper electrode comprising first, second, and third layers with the second layer being disposed between the first and third layers, wherein the second layer comprises a material different from a material comprising either of the first and third layers;
wherein the dielectric layer is composed of organic resin.

25. A thin film capacitor comprising:
a lower electrode;
an insulating layer formed burying said lower electrode therein and formed with a via-hole reaching said lower electrode;
a dielectric layer formed on an inner sidewall of said via-hole and covering an exposed surface of said lower electrode therewith; and
an upper electrode surrounded by said dielectric layer, the upper electrode comprising first, second, third, and fourth layers with the second layer being disposed between the first and third layers, and the third layer being disposed between the second and fourth layers, wherein the second layer comprises a material different from a material comprising either of the first and third layers.

26. The thin film capacitor of claim 25, wherein the third layer comprises a material different from a material comprising either of the second and fourth layers.

27. The thin film capacitor of claim 26, wherein each of the first, second, third, and fourth layers is electrically conductive, the second and fourth conductive layers being composed of a metal or metals selected from the group consisting of copper, silver, aluminum, metals belonging to group VIIIa, and metals belonging to group Ib.

28. The thin film capacitor of claim 27, wherein the first and third electrically conductive layers are composed of a metal or metals selected from the group consisting of metals belonging to group IVa, metals belonging to group Va, metals belonging to group VIa, and alloys thereof.

29. The thin film capacitor of claim 26, wherein the first and third electrically conductive layers are composed of a metal or metals selected from the group consisting of metals belonging to group IVa, metals belonging to group Va, metals belonging to group VIa, and alloys thereof.

30. The thin film capacitor of claim 25, wherein the dielectric layer is composed of organic resin.

* * * * *

UNITED STATES PATENT AND TRADEMARK OFFICE
CERTIFICATE OF CORRECTION

PATENT NO. : 6,278,153 B1
DATED : August 21, 2001
INVENTOR(S) : Kikuchi, Katsumi, Shimoto, Tadanorl, Matsui, Koji and Shibuya, Akinobu It is certified that error appears in the above-identified patent and that said Letters Patent is hereby corrected as shown below:

Column 42,
Line 62, replace "vi-hole" with -- via hole --.

Column 43,
Line 63, replace "A thin film capacitor comprising:" with -- A substrate including a thin film capacitor therein, said thin film capacitor comprising: --

Column 44,
Line 52, after "therein," insert -- said thin film capacitor comprising: --

Signed and Sealed this

Twenty-eighth Day of May, 2002

Attest:

JAMES E. ROGAN
Attesting Officer    Director of the United States Patent and Trademark Office

UNITED STATES PATENT AND TRADEMARK OFFICE
CERTIFICATE OF CORRECTION

PATENT NO.      : 6,278,153 B1
DATED           : August 21, 2001
INVENTOR(S)     : Kikuchi, Katsumi et al.

It is certified that error appears in the above-identified patent and that said Letters Patent is hereby corrected as shown below:

<u>Column 42,</u>
Line 62, replace "vi-hole" with -- via hole --.

<u>Column 43,</u>
Line 63, replace "A thin film capacitor comprising:" with -- A substrate including a thin film capacitor therein, said thin film capacitor comprising: --

<u>Column 44,</u>
Line 52, after "therein," insert -- said thin film capacitor comprising: --

Signed and Sealed this

Twentieth Day of January, 2004

JON W. DUDAS
*Acting Director of the United States Patent and Trademark Office*